(12) United States Patent
Yamamoto

(10) Patent No.: US 7,745,303 B2
(45) Date of Patent: Jun. 29, 2010

(54) METHOD OF MANUFACTURING A SEMICONDUCTOR DEVICE AND THE SEMICONDUCTOR DEVICE

(75) Inventor: Hirohisa Yamamoto, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/492,823

(22) Filed: Jul. 26, 2006

(65) Prior Publication Data
US 2007/0026632 A1 Feb. 1, 2007

(30) Foreign Application Priority Data
Jul. 26, 2005 (JP) ............... 2005-215390

(51) Int. Cl.
*H01L 21/76* (2006.01)
(52) U.S. Cl. ...................... 438/424; 257/510
(58) Field of Classification Search ............ 438/424
See application file for complete search history.

(56) References Cited

U.S. PATENT DOCUMENTS

| 5,668,044 | A | * | 9/1997 | Ohno ........................ 438/433 |
| 5,719,085 | A | * | 2/1998 | Moon et al. ................ 438/424 |
| 5,780,346 | A | * | 7/1998 | Arghavani et al. .......... 438/296 |
| 5,843,846 | A | * | 12/1998 | Nguyen et al. ............. 438/713 |
| 6,153,480 | A | * | 11/2000 | Arghavani et al. .......... 438/296 |
| 2002/0117711 | A1 | * | 8/2002 | Yoneda ....................... 257/330 |
| 2003/0162372 | A1 | * | 8/2003 | Yoo ............................ 438/484 |
| 2004/0076050 | A1 | * | 4/2004 | Hsieh ......................... 365/200 |
| 2004/0142538 | A1 | * | 7/2004 | Takahashi .................. 438/424 |
| 2004/0253831 | A1 | * | 12/2004 | Sun et al. ................... 438/757 |
| 2005/0233598 | A1 | * | 10/2005 | Jung et al. ................. 438/785 |

FOREIGN PATENT DOCUMENTS

| CN | 1402331 A | 3/2003 |
| JP | 2000-299374 | 10/2000 |
| JP | 3420103 | 4/2003 |
| JP | 2004-228457 | 8/2004 |

* cited by examiner

*Primary Examiner*—Thao X Le
*Assistant Examiner*—Kimberly Trice
(74) *Attorney, Agent, or Firm*—McDermott Will & Emery LLP

(57) ABSTRACT

The present invention provides a method of manufacturing a trench with a rounded corner portion and a broadened opening. Anisotropic oxidation is carried out using a halogen oxidation method using dichloroethylene (DCE) to form an anisotropic oxide film such that the film thickness in a shoulder portion of the trench is thick and gradually decreases nearer the bottom, the anisotropic oxide film is removed, and the shoulder portion of the trench is preferentially backed off, thereby rounding the shoulder portion sufficiently to broaden the opening. Then, an insulating member is embedded in the trench. The rounded portion of the shoulder portion of the trench and vicinity thereof is used as a channel of a MOS transistor.

6 Claims, 17 Drawing Sheets

METHOD OF MANUFACTURING A SEMICONDUCTOR DEVICE AND THE SEMICONDUCTOR DEVICE

BACKGROUND OF THE INVENTION

In recent years, as an element isolation structure in an LSI device, an STI (Shallow Trench Isolation) structure has been adopted that enables dimensions of an element isolation region to be controlled with high accuracy, as a substitute for a LOCOS structure. The STI structure is an element isolation structure that is formed by forming a shallow trench with an almost perpendicular side wall in a semiconductor substrate and embedding an insulating layer in the trench and that is suitable for high-integration LSI.

The importance of rounding an upper corner portion in forming a trench has conventionally been pointed out (for example, JP 2000-299374).

In other words, when an upper end portion (shoulder portion) of a trench formed in a semiconductor substrate is not rounded and remains a shape with an acute angle, the possibility of causing following inconvenience increases.

Concentration of an electric field tends to occur. The embedding characteristic deteriorates when an insulating layer is embedded in the trench, and a void tends to occur inside the trench (particularly, near the surface of the trench). Further, the leak current tends to occur in the upper end portion of the trench.

Further, such inconvenience tends to occur that an insulating layer embedded in the trench rises in the upper end portion of the trench, thereby loses the flatness, and has an adverse effect on a conductive layer provided on the insulating layer.

Therefore, methods have been proposed of rounding the shoulder portion of the trench. Related art in Patent Document 1 describes a method of forming a sacrifice oxide film and removing the film and another method of optimizing a composition of etching gas and etching conditions.

Further, in above-mentioned JP 2000-299374, a mask in an inverse-tapered specific shape is formed as a trench processing mask, and using the mask, the corner portion of the trench is rounded.

Furthermore, the applicant of the present invention previously proposed an anisotropic oxidation technique of halogen-oxidizing an internal portion of a trench using dichloroethylene (DCE: $C_2H_2Cl_2$), and by this halogen oxidation, making the thickness of the oxide film in a shoulder portion of the trench thicker than the thickness of the oxide film in the other portion in the trench (JP 2004-228457).

With further progress in fine patterning in LSIs, the width of the trench is made narrower. With the narrowed width, it is made difficult to embed an oxide film (insulating film) uniformly in the narrow trench, and a void tends to occur.

The void is apt to be a source of generating foreign substances. When the void is exposed at the surface of the wafer with the insulating film polished, the risk increases that a short circuit occurs in wiring, or some adverse effect is imposed on wiring.

In order to prevent the occurrence of a void in the embedded insulating film, it is effective to round a corner of a shoulder portion of the trench to broaden an opening. However, among methods described in above-mentioned JP 2000-299374, in the method of removing a sacrifice oxide film, the effect of processing of rounding a corner portion is small in a single time, and formation and removing of the sacrifice oxide film needs to be repeated over a plurality of times. Accordingly, there are fears that the process is complicated and that damage in the trench is accumulated.

Further, in the method of rounding a corner portion of the trench while varying a composition of etching gas and etching conditions, the effect of rounding is not so significant, and the embedding characteristic of the insulating film in the fine trench is not greatly improved.

Furthermore, as the fine patterning in LSI proceeds, the size decreases of an insulating gate type field-effect transistor packed in a semiconductor substrate, and with the decrease, the current capability decreases in the transistor. With consideration given to the fact that the STI and transistor are disposed adjacent to each other, in forming shallow trench isolation (STI), it is important to also consider the effect of improving characteristics of the transistor (i.e. consider the method of forming STI in terms of improving characteristics of the transistor), but the above-mentioned STI forming method lacks this point of view.

The present invention is carried out in the view of the above-mentioned consideration, and it is an object of the invention to sufficiently back off a shoulder portion (upper end portion of an opening) of the trench while adequately rounding a corner portion to broaden the opening in a single time of processing, and implement an excellent embedding characteristic of an insulating film filled in the trench to prevent the occurrence of a void. It is another object to assure high-accuracy formation of a minute trench even when the shoulder portion of the trench is backed off. Further, it is still another object to form the trench so as to contribute to enhancement of current capability of an insulting gate type field-effect transistor formed adjacent to the trench.

SUMMARY OF THE INVENTION

In a method of manufacturing a semiconductor device of the invention, an inner surface of a trench formed in part of a semiconductor substrate is oxidized by an anisotropic oxidation method, and a sacrifice oxide film is formed such that a thickness of the oxide film in a shoulder portion of the trench is thicker than a thickness of the oxide film in the other portion of the trench and that the thickness is locally different. Next, the sacrifice oxide film is removed. According to these steps, the shoulder portion of the trench is preferentially backed off, an opening of the trench is broadened, and at the same time, the shape of the shoulder portion is rounded. By this means, the trench is formed in a shape suitable for uniform embedding of an oxide film and the like (deposition of the oxide film and the like by CVD or the like).

"Anisotropic oxidation" in the invention is an oxidation method which provides an oxidizing rate with dependence on crystal face orientation, position on the semiconductor substrate, shape of the processed semiconductor substrate and the like, and which can be distinguished from isotropic oxidation. For example, anisotropic oxidation includes a halogen oxidation method for performing oxidation using a gas including a halogen element. When anisotropic oxidation is carried out in a narrow trench, for example, such an effect is caused that oxidation is particularly accelerated at the crystal face of the shoulder portion of the trench. As reasons of this phenomenon, it is considered that the halogen element functions as a catalyst and promotes bonding of the oxygen and silicon, the concentrations of oxygen and halogen element are high near the shoulder portion of the trench, and that oxygen molecules and halogen molecules are able to move freely near the shoulder portion. The concentrations of oxygen and halogen element decrease nearer the bottom of the trench, movement of molecules is restricted in the trench, and therefore, such an effect is also obtained that the thickness of the oxide film decreases gradually nearer the bottom of the trench from the shoulder portion of the trench. As a result, a difference is emphasized between the film thickness near the bottom of the trench and the film thickness in the shoulder portion of the trench. For the aforementioned reasons, the film thickness in the shoulder portion of the trench is thicker than the film thickness near the bottom of the trench, as compared with the case of oxidation generally assumed to have isotropy, and the anisotropic oxide film is thus obtained.

In the invention, the anisotropic oxide film is used as a sacrifice oxide film (that is formed to be removed). Removing of the anisotropic sacrifice oxide film contributes to "backing off the shoulder portion of the trench intentionally and preferentially and broadening the opening of the trench" and "rounding sufficiently the corner portion of the backed shoulder portion".

In a preferred aspect of the method of manufacturing a semiconductor device, the thickness of the sacrifice oxide film decreases nearer the bottom from the shoulder portion in the trench. By removing the sacrifice oxide film, a side wall of the trench is formed with moderate inclination toward the opening from near the bottom of the trench. Further, the opening becomes wide steeply by the effect of rounding the corner portion.

Further, in another preferred aspect of a method of forming a trench of the invention, used as anisotropic oxidation is halogen oxidation using a gas containing a halogen element.

Halogen elements are of the seventeenth group of the periodic system. Chlorine ($Cl_2$) and bromine ($Br_2$) are gases at room temperature, and can be used as an oxidizing species (reactive gas) rich in reactivity. It is considered that the halogen element is not directly involved in oxidation as an oxidizing species, but functions as a catalyst, and acts to promote bonding of oxygen and silicon. Further, for the reasons that the concentrations of oxygen and halogen element are high near the shoulder portion of the trench, and that oxygen molecules and halogen molecules are able to move freely near the shoulder portion, in the shoulder portion of the trench is formed a thick oxide film that can be distinguished from typical isotropic oxidation. Among factors having an effect on the oxidizing rate of the halogen oxidation method are crystal face orientation, and the position and shape of a portion to be oxidized. Particularly, the oxidation method using DCE (dichloroethylene) exhibits remarkable anisotropy, and therefore, is suitable for efficient formation of an anisotropic oxide film.

In another preferred aspect of the method of manufacturing a semiconductor device of the invention, dichloroethylene (DCE: $C_2H_2Cl_2$) is used as an oxidizing species. The halogen oxidation method with dichloroethylene developed by the applicant of the invention is suitable for efficient formation of an anisotropic oxide film, such that the thickness in the shoulder portion of the trench is sufficiently thicker than that in the other portion and that the effect of rounding the corner portion is significant, in oxidizing processing in a single time.

In another preferred aspect of the method of manufacturing a semiconductor device of the invention, hydrogen chloride (HCl) or hydrogen bromide (HBr) is used as a halogen oxidizing species. The halogen oxidation method using a mixed gas of a gas containing oxygen ($O_2$) or $N_2O$ and hydrogen chloride (HCl) or hydrogen bromide (HBr) is suitable for efficient formation of an anisotropic oxide film, such that the thickness in the shoulder portion of the trench is sufficiently thicker than that in the other portion and that the effect of rounding the corner portion is significant, in oxidizing processing in a single time.

In another preferred aspect of the method of manufacturing a semiconductor device of the invention, an etching mask having a side wall is formed, and using the etching mask, a trench with a narrow width is formed. Next, the side wall is removed, and then, anisotropic oxidation is carried out. The side wall compensates for broadening of a width of the trench by backing off the shoulder portion of the trench, and enables formation of a minute trench. Further, by the side wall being removed before forming the anisotropic oxide film, the opening of the trench is broadened, and the oxidizing species are made easily reach the upper end portion of the trench, thus contributing to the increased thickness of the anisotropic oxide film in the end portion of the opening of the trench. Furthermore, the opening being broadened by removal of the side wall is useful in improving the embedding characteristic in embedding an oxide film and the like in subsequent steps.

In another preferred aspect of the method of manufacturing a semiconductor device of the invention, the above-mentioned side wall is formed by etching an oxide film such as a TEOS (Tetra Ethyl Orthosilicate) oxide film with good film-thickness controllability in the vertical direction by anisotropic etching such as Reactive Ion Etching (RIE).

In another preferred aspect of the method of manufacturing a semiconductor device of the invention, an isotropic oxide film with a uniform thickness is formed on the inner surface of the trench, and then, an insulating film is embedded in the trench. The isotropic oxide film contributes to a function of preventing damage to the semiconductor substrate in embedding the insulating film in the trench, relief of stress between the embedded insulating film and the inner wall of the trench, promotion of smooth embedding, and the like.

In another preferred aspect of the method of manufacturing a semiconductor device of the invention, the isotropic oxide film on the inner surface of the trench is formed by In situ steam generation oxidation.

In situ steam generation oxidation is an oxidation method for introducing a hydrogen gas and a gas containing oxygen into a chamber with low pressure, and causing oxidation reaction directly on the surface of a heated semiconductor substrate. This oxidation method provides higher oxidizing reactivity than in typical dry oxidation, and is useful in forming an oxide film with high controllability, good quality and uniform thickness inside the trench.

In another preferred aspect of the method of manufacturing a semiconductor device of the invention, an $O_2$ gas or $N_2O$ gas is used in In situ steam generation oxidation.

In another preferred aspect of the method of manufacturing a semiconductor device of the invention, the isotropic oxide film on the inner surface of the trench is formed by an oxygen ($O_2$) plasma oxidation method for oxidizing the surface of a semiconductor substrate by oxygen excited by plasma.

Oxygen ($O_2$) plasma oxidation provides almost no difference in oxidizing rate due to crystal face orientation, and contributes to formation of good-quality isotropic oxide film without additional heating.

In another preferred aspect of the method of manufacturing a semiconductor device of the invention, a nitride film is formed on the isotropic oxide film with the uniform thickness formed on the inner surface of the trench.

The silicon nitride film serves a function of preventing the occurrence of a situation that the oxide film on the inner surface of the trench is supplied with oxygen from the embedded oxide film and grows (expands) unnecessarily in performing heat treatment in a subsequent step. When the oxide film on the surface of the trench expands even slightly, the width of the trench increases, and such fears arise that the stress between the silicon substrate and oxide film increases to increase the interface state density, and that the leak current increases. Therefore, the nitride film is provided as a buffer between the embedded oxide film (TEOS oxide film) and the oxide film on the inner surface of the trench to interrupt movement of oxygen. Further, the nitride film also serves a function of preventing damage to the surface of the silicon substrate in embedding the oxide film (TEOS oxide film) in the trench.

In another preferred aspect of the method of manufacturing a semiconductor device of the invention, after embedding the insulating film in the trench and performing CMP processing on the insulating film, the insulating film is etched back, and is thereby embedded in a position lower than the upper end portion of the opening of the trench. In other words, in order to enable the rounded shoulder portion of the trench and vicinity thereof to be used as a channel region of a MOS transistor, the position of the surface of the insulating film embedded in the trench is made lower than the position of the opening of the trench.

In other words, when the gate oxide film is formed and the gate electrode layer is installed in subsequent steps, the gate electrode layer sinks slightly on the trench. When the voltage is applied to the gate electrode layer in this state, the electric field acts on the surface of the semiconductor substrate in the rounded shoulder portion of the trench and vicinity thereof, and the channel is induced. By using the rounded corner portion as a channel, the gate width (W) of the MOS transistor is increased, and the channel conductance (W/L: L is the channel length) increases in the MOS transistor, thereby suppressing reduction in the current capability of the MOS transistor due to fine patterning.

In another preferred aspect of the method of manufacturing a semiconductor device of the invention, after trench isolation is formed by the method of the invention, an insulating gate type field-effect transistor is formed. In other words, a gate insulting film is formed to cover the rounded shoulder portion of the trench. Then, the gate electrode layer is provided on the gate insulating film to extend onto the rounded shoulder portion of the trench, thereby enabling the rounded shoulder portion of the trench and vicinity thereof to be a channel region of the insulating gate type field-effect transistor. It is thus possible to embed a uniform insulating film in the trench, assure flatness in the shoulder portion of the trench, and form a gate oxide film with good quality. Further, the rounded shoulder portion and vicinity thereof is made usable as a channel region of the MOS transistor, and it is possible to increase the gate width (W) of the MOS transistor, further increase the channel conductance (W/L: L is the channel length) of the MOS transistor, and suppress reduction in the current capability of the MOS transistor due to fine patterning.

A semiconductor device of the invention has at least one trench formed by the method of the invention. The semiconductor device functions as high-quality ultra LSI capable of making fabrication of a finer trench compatible with suppression of occurrence of foreign substance by improving the embedding characteristic of the insulating film, concentration of the electric field by rounding the shoulder portion, and relief of the stress.

In a preferred aspect of the semiconductor device of the invention, the device is manufactured by the method of manufacturing a semiconductor device of the invention.

The semiconductor device enables uniform embedding of the insulating film in the trench, assurance of flatness in the shoulder portion of the trench, and assurance of formation of a gate oxide film with good quality. Further, the semiconductor device enables the rounded shoulder portion and vicinity thereof to be used as a channel region of the MOS transistor, and is capable of increasing the gate width (W) of the MOS transistor, further increasing the channel conductance (W/L: L is the channel length) of the MOS transistor, and suppressing reduction in the current capability of the MOS transistor due to fine patterning.

Another preferred aspect of the semiconductor device of the invention has shallow trench isolation (STI) having a trench with a broadened opening and a rounded shoulder portion, and an insulating member embedded in the trench in a position lower than an upper end of the opening of the trench, and an insulating gate type transistor which is formed adjacent to the shallow trench isolation (STI) and includes as structural elements a gate insulating film formed to cover also the rounded shoulder portion of the trench on the trench isolation, and a gate electrode layer provided to extend onto the rounded shoulder portion of the trench on the gate insulating film, whereby the rounded shoulder portion of the trench and vicinity thereof functions as a channel region.

The semiconductor device enables uniform embedding of the insulating film in the trench, assurance of flatness in the shoulder portion of the trench, and assurance of formation of a gate oxide film with good quality. Further, the semiconductor device enables the rounded shoulder portion of the trench and the vicinity thereof to be used as a channel region of the MOS transistor, and is thereby capable of suppressing reduction in the current capability of the MOS transistor due to fine patterning. The gate insulating type transistor includes an insulating gate type bipolar transistor such as IGBT.

Another preferred aspect of the semiconductor device of the invention has an insulating gate type transistor constituting an input protection circuit. In the insulating gate type transistor in the semiconductor device of the invention, as described above, the current capability is improved by using a region of the rounded shoulder portion of the trench as a channel. Accordingly, the transistor can be used as a transistor constituting an input protection circuit required of absorbing instantaneous large surge current.

Another preferred aspect of the semiconductor device of the invention has an insulating gate type transistor as a discrete element. For example, the invention can be used in manufacturing a power MOS transistor with a trench-gate structure.

In another preferred aspect of the semiconductor device of the invention, the semiconductor device is DRAM (Dynamic Random Access Memory). The DRAM has a high degree of integration and less failure. Further, in another preferred aspect of the semiconductor device of the invention, the semiconductor device is SRAM (Static Random Access Memory). The SRAM has a high degree of integration and less failure.

Furthermore, in another preferred aspect of the semiconductor device of the invention, the semiconductor device is Flash Memory. The Flash Memory has a high degree of integration and less failure.

In another preferred aspect of the semiconductor device of the invention, the semiconductor device is MEMS (Micro Electro Mechanical System). For example, the MEMS uses the manufacturing technique of MOSLSI in performing fine processing on the silicon substrate. Also in the MEMS, there is a demand for formation of a minute trench, demands are considered for providing the inner wall of the trench with inclination, backing off the shoulder portion preferentially to broaden the opening, or rounding the corner portion of the shoulder portion, and the invention is usable in manufacturing a MEMS element.

Another preferred aspect of the semiconductor device of the invention has a capacitor (trench capacitor) using a trench formed by the method of the invention.

The trench formed by the method of the invention has a forward tapered shape, and a rounded shoulder portion, where the surface area inside the trench is larger than that of the general trench, and accordingly, is suitable for manufacturing of a trench capacitor with large capacitance.

In another preferred aspect of manufacturing a semiconductor device of the invention, the semiconductor substrate is processed by the method of the invention, and a three-dimensional structure is formed with the corner portion rounded. In other words, the method of forming a trench of the invention is used as a technique for processing a semiconductor substrate to form a fine three-dimensional semiconductor structure.

A transistor of the invention is a transistor configured to include a three-dimensional structure with the corner portion rounded. For example, the transistor is a three-dimensional transistor (tri-gate transistor) formed by forming current channels on three different faces of the three-dimensional structure.

BRIEF DESCRIPTION OF THE DRAWINGS

FIG. 2H is a cross-sectional view of a device of a comparative example;

DESCRIPTION OF THE PREFERRED EMBODIMENTS

Figure 1A:
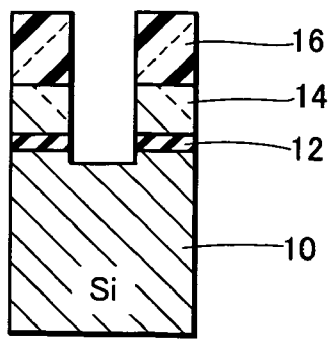
FIGS. 1A to 1I are cross-sectional views of main part of a device for each primary step showing from an initial step to a deposit step of an oxide film to embed in a trench in an example of a method of forming a trench of the invention.

In the present invention, a sacrifice oxide film comprised an anisotropic oxide film is removed to form a trench with a corner portion thereof broadened and rounded. The method conventionally consists of forming a sacrifice oxide film (that is formed to be removed) and rounding a corner portion of a shoulder portion of a trench by removing the film. It is a significant feature of the invention that the formed sacrifice oxide film is an oxide film with anisotropy (an oxide film such that the thickness in the shoulder portion is thicker than the thickness in the other portion, and thus the thickness is locally different; hereinafter, referred to as an anisotropic oxide film.)

The anisotropic oxide film is formed in such a manner that the thickness in the shoulder portion of the trench is thicker than the thickness in the other portion and that the thickness is locally different, as a result of oxidizing the inner surface of the trench using a method of anisotropic oxidation (oxidation such that the oxidizing rate has characteristics dependent on crystal face orientation, position on the semiconductor substrate, shape of the processed semiconductor substrate and the like.) From the microscopic viewpoint, anisotropy (property such that the oxidizing rate varies with crystal face orientation) may be observed to some extent in any oxidation methods. "Anisotropic oxidation" of the invention is distinguished from such oxidation included in a range of isotropic oxidation.

Further, "anisotropic oxidation" in the invention is anisotropic oxidation in a broad sense, and of concept including not only oxidation (conventionally so-called anisotropic oxidation generally) such that the oxidizing rate has crystal-face dependence, but also the case where the oxidizing rate is dependent on the position on the semiconductor substrate, shape of the processed semiconductor substrate and the like, for example. In other words, "anisotropic oxidation" in the invention is an oxidation method which provides an oxidizing rate with dependence on crystal face orientation, position on the semiconductor substrate, shape of the processed semiconductor substrate and the like, and which can be distinguished from isotropic oxidation, and as described previously, includes a halogen oxidation method of performing oxidation using a gas containing a halogen element.

When anisotropic oxidation is carried out in a narrow trench, for example, such an effect is caused that oxidation is particularly accelerated in the crystal face of the shoulder portion of the trench. As reasons of this phenomenon, it is considered that the halogen element serves a catalyst-like function and promotes bonding of oxygen and silicon, the concentrations of oxygen and halogen element are high near the shoulder portion of the trench, and further, oxygen molecules and halogen molecules are able to move freely near the shoulder portion.

The concentrations of oxygen and halogen element decrease nearer the bottom of the trench, movement of molecules is restricted in the trench, and therefore, such an effect is also obtained that the thickness of the oxide film decreases gradually from the shoulder portion of the trench to the bottom of the trench. As a result, the difference is emphasized between the thickness near the bottom of the trench and the thickness in the shoulder portion of the trench. For the aforementioned reasons, the film thickness in the shoulder portion of the trench is thicker than the film thickness near the bottom of the trench, as compared with the case of oxidation generally assumed to have isotropy, and the anisotropic oxide film is thus obtained.

Thus, "anisotropic oxide film" in the invention is an oxide film such that the thickness is locally different. The invention uses the anisotropic oxide film as a sacrifice oxide film, "removes" the anisotropic oxide film to implement backing off and rounding of the shoulder portion of the trench, has in this respect a significant feature, and allows any methods in regard to "formation" of the anisotropic oxide film. The sacrifice oxide film comprised of such an anisotropic oxide film can be formed by oxidation processing in a single time using a predetermined method, and is extremely efficient.

Then, in the invention, it is possible to concurrently obtain both the effect of "backing off the shoulder portion of the trench intentionally and preferentially and broadening the opening of the trench" and the effect of "rounding sufficiently the corner portion of the backed shoulder portion" by removing the sacrifice oxide film with anisotropy. Unlike the conventional technique of simply rounding a corner, the present invention enables the shoulder portion of the trench to be backed off effectively by removing the thick oxide film formed in the shoulder portion of the trench.

The opening is broadened, while the corner portion is sufficiently rounded, the embedding characteristic is thereby improved in embedding an insulating film in a trench by plasma CVD or the like, and a void becomes hard to occur. Further, since the corner portion of the trench is adequately rounded, risks are reduced of stress concentration and electric field concentration in the upper end portion of the trench. Furthermore, since a void does not occur in the trench, flatness of the embedded oxide film is improved. Still furthermore, the rounded corner portion and the vicinity thereof can be used as a channel region of the insulating gate type electric-field transistor (MOS transistor), and it is thereby possible to assure the required channel width even in the MOS transistor with the size reduced.

Examples of the present invention will specifically be described below with reference to accompanying drawings.

Embodiment 1

FIGS. 1A to 1I are cross-sectional views of main part of a device for each primary step showing from an initial step to a deposit step of an oxide film to embed in a trench in an example of a method of forming a trench of the invention.

Figure 1F:
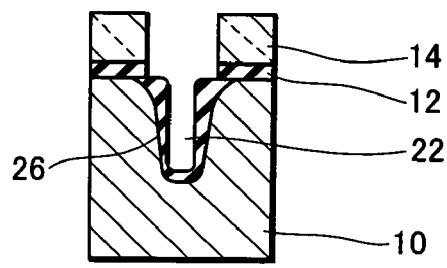
Figure 1B:
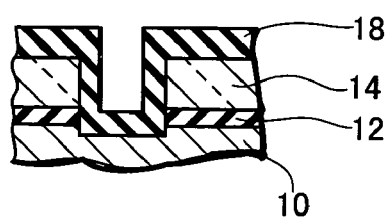
Figure 1G:
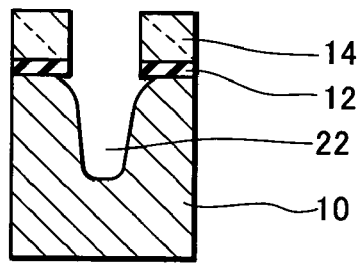

Primary features of the manufacturing process as shown in FIG. 1 are that a side wall 20 is formed in a step of forming a trench processing mask (FIG. 1C), anisotropic oxidation is carried out after removing the side wall 20 and broadening an opening (FIGS. 1E and 1F), and that the area of the opening is intentionally increased by removing the anisotropic oxide film and preferentially backing off an upper end portion (shoulder portion) of a trench, while rounding a corner portion sufficiently (FIG. 1G). The aforementioned features will specifically be described below.

First, as shown in FIG. 1A, a silicon oxide film 12 with a thickness ranging from about 10 to 20 nm is formed on a semiconductor substrate (p-type silicon substrate) 10 by thermal oxidation.

Next, a silicon nitride film (SiN film) 14 is with a thickness range from about 100 to 200 nm is deposited on the silicon oxide film 12 by CVD. Then, a photoresist 16 is formed to perform patterning.

Then, using the patterned photoresist mask 16, patterning is performed on the silicon nitride film 14, and subsequently, patterning is performed on the silicon oxide film 12 using the photoresist film 16 and silicon nitride film 14 as a mask.

Herein, as a mode of patterning, there are a mode of exposing the surface of the silicon substrate 10, a mode of shaving the surface of the silicon substrate 10, and a mode of halting etching in the middle of the silicon oxide film 12, and any of patterning modes may be adopted.

Even when etching is halted in the middle of the silicon oxide film 12, the residual oxide film 12 is removed in removing a TEOS oxide film in a subsequent step (step (C)), and therefore, any problems do not occur. After the patterning, the photoresist film 16 is removed.

Figure 1C:
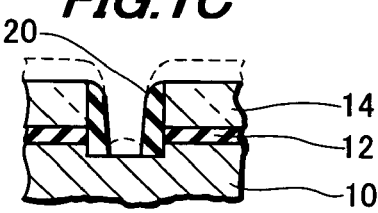

Next, in the steps as shown in FIGS. 1B and 1C, the side wall 20 is formed that constitutes part of the etching mask. This step is not indispensable, but in consideration of resects of forming a minute trench, obtaining an anisotropic oxide film having a sufficiently thick thickness near the opening, and depositing oxide uniformly deposited in the trench without voids, is preferably provided.

In other words, preferentially backing off the shoulder portion of a trench 22 by removing an anisotropic oxide film 26 performed in the step of FIG. 1 needs to be compatible with forming a minute trench. Therefore, to prepare for backing off of the shoulder portion of the trench 22, the side wall 20 is formed to compensate for the backing off, and the semiconductor substrate 10 is etched using the etching mask including the side wall 20 to form the trench 22.

By this means, even when adopting the manufacturing process where the anisotropic oxide film 26 is removed, it is possible to form the minute trench 22. Further, since the side wall is removed before forming the anisotropic oxide film 26, the opening of the trench is broadened, and the oxidizing species are made easily reach the upper end portion of the trench, thus contributing to the increased thickness of the anisotropic oxide film in the end portion of the opening of the trench. Furthermore, the opening being broadened by removal of the side wall is useful in improving the embedding characteristic in embedding an oxide film and the like in subsequent steps.

The formation of the side wall will specifically be described below. As shown in FIG. 1B, a thin oxide film 18 with a thickness of about 50 nm is deposited on the entire surface of the semiconductor substrate using CVD. The type of the oxide film is not limited particularly, but for example, a TEOS (Tetra Ethyl Orthosilicate) oxide film that is an oxide film with high controllability and good quality is preferably deposited using LPCVD (Low Pressure CVD), APCVD (Atmospheric Pressure CVD) or the like.

Next, by anisotropic etching such as Reactive Ion Etching (RIE), the CVD oxide film (herein, TEOS oxide film) 18 is etched in the vertical direction, and the side wall 20 is thereby obtained as shown in FIG. 1C. Then, nitrogen annealing processing is performed.

Figure 1H:
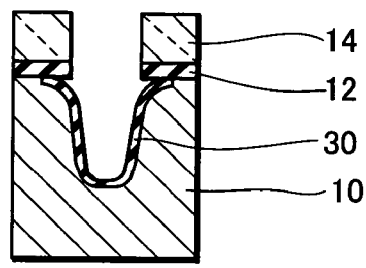
Figure 1D:
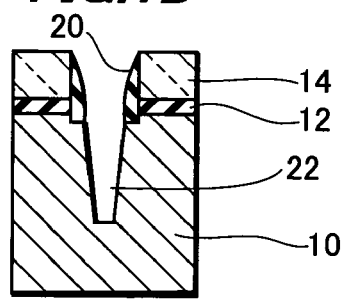

Then, as shown in FIG. 1D, the silicon substrate is dry-etched using the etching mask comprised the photoresist film 16, silicon nitride film 14 and side wall 20. In this way, the trench (groove) 22 with the substantially perpendicular side wall with a depth of about 250 nm is formed on the silicon substrate 10.

Figure 1I:
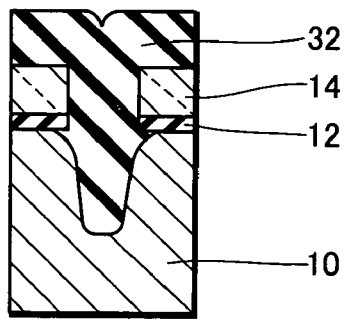
Figure 1E:
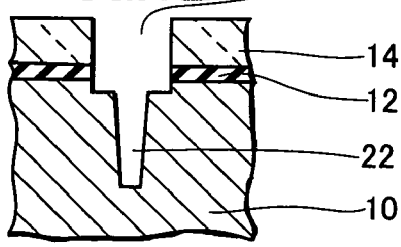

Subsequently, as shown in FIG. 1E, the side wall (that is comprised of the TEOS oxide film) 20 is removed by wet etching (step of first removal of the oxide film). By this means, the width of the opening of the etching mask (12, 14) is made wider than the width of the trench 22. This makes the oxidizing species easily reach the upper end portion (shoulder portion) of the trench in performing anisotropic oxidation in the subsequent step (FIG. 1F), and thus contributes to making the thickness of the anisotropic oxide film 26 sufficiently thick near the shoulder portion of the trench.

Further, the increased width of the opening of the etching mask promotes uniform deposition of oxide 32 in depositing the oxide 32 in the trench 22 in the step of FIG. 1I, and also contributes to reduction in void.

Next, as shown ion FIG. 1F, anisotropic oxidation is performed, and the anisotropic oxide film is formed such that the thickness in the upper portion (shoulder portion) of the trench is thicker than that in the other portion and that the thickness is locally different. For example, the anisotropic oxide film can be formed using halogen oxidation (an oxidation method of supplying a gas containing a halogen element onto the surface of the semiconductor to cause oxidation). Halogen elements are elements of the seventeenth group of the periodic system, and generally have the property rich in reactivity. Chorine ($Cl_2$) and bromine ($Br_2$) are gas at room temperature, and can be used as a gas to introduce into a chamber. As a specific halogen oxidation method, for example, there are a halogen oxidation method using dichloroethylene (DCE), and another halogen oxidation method using hydrogen chloride (HCl) or hydrogen bromide (HBr). In any methods, oxidation is caused by the reactive gas obtained by mixing a minute quantity of halide with a gas containing oxygen ($O_2$ and/or $N_2O$).

Among the above-mentioned methods, particularly, when using the halogen oxidation method using dichloroethylene (DCE), it is possible to efficiently form in a single time of processing an oxide film with anisotropy such that the film thickness is sufficiently thick in the shoulder portion of the trench, and that the thickness gradually increases nearer the upper end portion (shoulder portion) from the bottom of the trench 22. The halogen oxidation method is oxidation with strong anisotropy ease to reflect crystal face orientation, and suitable for the processing of preferentially backing off the shoulder portion of the trench and sufficiently rounding the corner portion.

As described previously, the anisotropic oxide film is formed in such a manner that the thickness in the shoulder portion is thicker than the thickness in the other portion and that the thickness is locally different, as a result of oxidizing the inner surface of the trench using a method of anisotropic oxidation (for example, oxidation with characteristics that the oxidizing rate varies depending on the position and the shape of a portion targeted for oxidation). From the microscopic viewpoint, anisotropy (property such that the oxidizing rate varies with crystal face orientation) may be observed to some extent in any oxidation methods. Anisotropic oxidation of the invention is not of such extremely weak anisotropy included in a range of isotropic oxidation, but an oxidation method that can be distinguished from isotropic oxidation, and as described above, includes the halogen oxidation method for causing oxidation using a gas containing a halogen element rich in reactivity. However, anisotropic oxidation usable to form the anisotropic oxide film of the invention is not limited to such oxidation, and any oxidation methods may be used such that the dependence of the oxidizing rate on crystal face orientation, the position and shape of an oxidation-target portion or the like is beyond a range of isotropic oxidation.

Then, when anisotropic oxidation is caused in a narrow trench, for example, such an effect is exhibited that oxidation in the shoulder portion of the trench is particularly accelerated.

In addition, since crystal face (100) with less crystal defect is used as a main surface of a semiconductor wafer, the crystal face of the bottom of the trench 22 is (100) face (including an equivalent face, the same as in followings), the crystal face of the side wall of the trench 22 is (010) face, and exposed in the shoulder portion (corner portion) are (111) face and others except (100) face and (010) face.

Obtained further is the effect (oxidation accelerating effect due to the high concentration of oxidizing species) that oxidizing species sufficiently arrive at the shoulder portion of an inlet of the trench and oxidation is further promoted, and since the oxidizing species are harder to reach nearer the bottom of the trench, the thickness of the oxide film tends to decrease gradually nearer the bottom of the trench. The halogen element such as Cl and the like is assumed to serve the catalyst-like function in oxidation reaction and act to promote anisotropic oxidation. The concentration of the halogen element is high near the shoulder portion of the surface of the trench, and the oxidizing rate is thereby increased in the shoulder portion of the trench. Further, the halogen element is able to move freely in the surface of the trench, and therefore, collides with the surface of the silicon substrate at various angles more frequently. Accordingly, in particular, oxidation is promoted in the shoulder portion of the trench, and a thick oxide film is formed exceeding a range of typical isotropic oxidation.

Further, in the same way as in the case of oxidizing species, the halogen element is harder to reach nearer the bottom of the trench, promoting the phenomenon that the thickness of the oxide film decreases nearer the bottom of the trench. According to the effects as described above, the film thickness profile is obtained that the film thickness in the shoulder portion of the trench becomes thicker than the film thickness near the bottom of the trench, as compared with the case of oxidation generally assumed to have isotropy, and that the thickness of the oxide film decreases gradually nearer the bottom from the surface of the trench.

In addition, in the case of halogen oxidation, it is estimated that factors of the position and shape of an oxidation-target portion are dominant (than the factor of crystal face orientation) among factors such as crystal face orientation and the position and shape of an oxidation-target portion that are considered having the effect on the oxidizing rate. The anisotropic oxide film is thus obtained.

The case will specifically be described below that the isotropic oxide film is formed by halogen oxidation using dichloroethylene (DCE).

A plurality of sheets of silicon wafers that are targets for halogen oxidation using dichloroethylene (DCE) is set horizontally in a chamber in parallel with one another. Meanwhile, to the chamber is connected a bubbler filled with liquid dichloroethylene (DCE) ($C_2H_2Cl_2$). The bubbler is installed in a thermostatic bath, nitrogen gas ($N_2$) is supplied to the bubbler as a carrier gas, liquid dichloroethylene (DCE) thereby undergoes bubbling, and the vaporized DCE gas is guided to the chamber. At the same time, oxygen ($O_2$) is supplied into the chamber. In addition, nitrogen oxide ($N_2O$) may be supplied as a substitute for oxygen.

Inside the chamber is carried out halogen oxidation of the inner surface of the trench formed in the silicon wafer. In other words, the following reaction is caused inside the chamber.

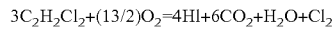

In this reaction, silicon is oxidized by the oxidizing species ($H_2O$) on the right side. In other words, by oxidizing the inner surface of the trench 22 by halogen oxidation shown in the above-mentioned chemical equation, it is possible to form a silicon oxide film with low stress and locally increased thickness in the corner portion (shoulder portion) of the trench.

Herein, described more specifically are conditions of halogen oxidation required to obtain the anisotropic oxide film.

The inside of the chamber is heated in a temperature range of 850° C. to 1000° C., and vaporized DCE is introduced into the heated chamber with oxygen and bubbler. As can be seen from the above-mentioned equation, halogen oxidation is carried out in the chamber by reaction with DCE in the presence of oxygen.

The silicon oxide film formed by halogen oxidation varies with the DCE concentration in an atmosphere of oxygen.

Experiments performed by the inventor of the invention and the like revealed that it is possible to use as a control factor the weight percentage of DCE obtained from the weight of oxygen introduced into the chamber and the weight of DCE introduced into the chamber by bubbling.

In the experiments, the weight of oxygen was 28.57 g when the flow rate of oxygen was 20 slm, 433 mg of DCE was introduced into a chamber 41 when nitrogen for bubbling was flowed with a flow rate of 200 sccm, and in the conditions, it was possible to obtain a silicon oxide film (anisotropic oxide film) with preferred characteristics and shape. The weight percentage of DCE in this case was 0.443/28.57 (=0.015), and thus 1.5%. In addition, the relationship between nitrogen for bubbling and oxygen in the above-mentioned conditions represented by flow rate percentage was 0.2/20 (=0.01) and thus 1%.

Further, by varying the flow rates of oxygen and nitrogen, the relationship between the weight percentage of the DCE concentration and fraction defective (%) and the relationship between the weight percentage of the DCE concentration and stress (MPa) in the upper end portion (corner portion) of the trench were examined to obtain a suitable range of the DCE concentration.

As the result, it was found out that the fraction defective was 20 to 18% and thus high when the weight percentage of the DCE concentration was in a range of 0.15% to 0.375%, while being 5% or less when such weight percentage is 0.45%, and from these results, the DCE concentration is preferably 0.45% by weight or more.

Accordingly, in the step of forming the anisotropic oxide film 26 in FIG. 1F, the concentration of dichloroethylene (DCE) in an atmosphere of oxygen is set at 0.45% by weight or more, and on this condition, oxidation of the inner surface of the trench is carried out.

In addition, as described above, in forming the anisotropic oxide film 26, halogen oxidation (HCl oxidation) using hydrogen chloride (HCl) can be used. In the case of implementing the HCL oxidation, the temperature range is 850° C. to 1000° C., and the semiconductor surface is oxidized using a mixed gas obtained by adding a minute quantity of hydrogen chloride (HCl) to oxygen ($O_2$) and/or nitrogen oxide ($N_2O$).

Similarly, halogen oxidation using hydrogen bromide (HBr) can be used. In the case of implementing the HBr oxidation, the temperature range is 850° C. to 1000° C., and the semiconductor surface is oxidized using a mixed gas obtained by adding a minute quantity of hydrogen bromide (HBr) to oxygen ($O_2$) and/or nitrogen oxide ($N_2O$).

Next, as shown in FIG. 1G, the anisotropic oxide film is removed (second removal of the oxide film) by wet etching.

By removing the anisotropic oxide film 26, it is possible to concurrently obtain both the effect of backing off the shoulder portion of the trench intentionally and preferentially and broadening the opening of the trench and the effect of rounding sufficiently the corner portion of the backed shoulder portion.

In other words, as shown in FIG. 1G, the opening is broadened, while the corner portion is sufficiently rounded, whereby the embedding characteristic is improved in embedding an insulating film in the trench 22 by plasma CVD or the like, and a void becomes hard to occur.

Further, since the corner portion of the trench 22 is adequately rounded, risks are reduced of stress concentration and electric field concentration in the upper end portion of the trench 22. Furthermore, since the corner portion of the trench 22 is rounded, the insulating film embedded in the trench is prevented from extremely protruding in protrusion-shape in the end portion of the trench, and flatness is assured. Therefore, such an effect is also obtained that it is possible in subsequent steps to form a good-quality gate oxide film with a uniform thickness in the portion (described later).

Moreover, the rounded corner portion and vicinity thereof can be used as a channel region of the insulating gate type electric-field transistor (MOS transistor), thereby contributing to assurance of the channel width in the MOS transistor with the size reduced (described later).

Further, after forming the anisotropic oxide film 26 such that the thickness decreases nearer the bottom from the shoulder portion in the trench 22, the anisotropic oxide film is removed, whereby the side wall of the trench 22 is formed with moderate inclination toward the opening from near the bottom of the trench. Then, the effect is obtained that the opening becomes wide steeply near the opening by the effect of rounding the corner portion, and the trench 22 is obtained in shape suitable for uniform embedding of the oxide film and the like (deposition of the oxide film and the like by CVD or the like). In addition, after the removing the above-mentioned anisotropic oxide film, it is also possible to perform processing for rounding the corner portion by heat treatment, by performing heat treatment in an atmosphere of hydrogen or Ar gas at high temperatures (900° C. to 1050° C.).

Next, as shown in FIG. 1H, the inner surface of the trench 22 undergoes isotropic oxidation, and the oxide film (isotropic oxide film) 12 with the uniform thickness is formed.

The isotropic oxide film 12 contributes to a function of preventing damage to the semiconductor substrate 10 in embedding the oxide 32 in the trench 22, relief of stress between the embedded oxide 32 and the inner wall of the trench 22, promotion of smooth embedding, and the like, in the step of FIG. 1I.

Isotropic oxidation is not limited particularly, but In situ steam generation oxidation may be used such that with a semiconductor substrate heated while reducing the pressure below the atmospheric pressure, a hydrogen gas and oxygen gas are reacted on the semiconductor substrate to form an oxide film.

In situ steam generation oxidation is an oxidation method for introducing hydrogen and oxygen into a chamber with low pressure, and causing oxidation reaction directly on the surface of a heated semiconductor substrate. This oxidation method provides higher oxidizing reactivity than in typical dry oxidation, enables isotropic oxidation not dependent on crystal face orientation by OH radicals, and thus, enables formation of an oxide film with high controllability, good quality and uniform thickness inside the trench. The heating temperature in causing oxidation ranges from 900° C. to 1100° C.

Further, as isotropic oxidation, oxygen ($O_2$) plasma oxidation may be used such that the surface of a semiconductor substrate is oxidized by oxygen excited by plasma.

It is known that $O_2$ plasma oxidation provides almost no difference in oxidizing rate due to crystal face orientation, and such an effect is obtained that it is possible to form a good-quality isotropic oxide film without heating.

For example, an $O_2$ plasma oxide film can be formed using a microwave plasma apparatus. For example, an $O_2$ plasma oxide film can be formed using a silicon direct oxidation method by oxygen radical using Kr (Krypton). The oxidation reaction by the silicon direct oxidation method by oxygen radical is as described below. In other words, the reaction is as described in following equations (2) to (4) in the case where the surface of the silicon substrate is oxidized using a mixed gas containing Kr (Krypton) and $O_2$ at a temperature of 400° C. In addition, a radical is an unpaired electron (and, an atom with the unpaired electron), and an atom of radical species has a property rich in reactivity. The radical species is described as (radical) in the following equations.

$$Kr + e \rightarrow Kr(radical) + e \quad (2)$$

$$Kr(radical) + O_2 \rightarrow Kr + 2O(radical) \quad (3)$$

$$Si + 2O(radical) \rightarrow SiO_2 \quad (4)$$

Next, as shown in FIG. 1I, for example, the TEOS oxide film 32 with a thickness of about 800 nm is deposited on the semiconductor substrate 10 and in the trench 22 by plasma CVD. At this point, the opening of the trench 22 is broadened, while the side wall is in a tapered shape, and it is thereby possible to implement excellent embedding (i.e. embedding without voids) of the TEOS oxide film 32.

Herein, steps of FIGS. 1A to 1I are compared with steps as shown in FIGS. 18A to 18D of a comparative example to confirm the effect of the method of forming a trench of the invention.

FIGS. 18A to 18D are cross-sectional views of a device for each primary step in a comparative example (example to show a result of the case without steps of formation and removal of an anisotropic oxide film) to clarify the effect of the method of forming a trench of the invention as shown in FIGS. 1A to 1I.

Figure 18A:
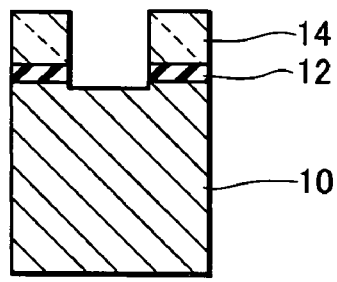
FIGS. 18A to 18D are cross-sectional views of a device for each primary step in a comparative example (example to show a result of the case without steps of formation and removal of an anisotropic oxide film) to clarify the effect of the method of forming a trench of the invention as shown in FIGS. 1A to 1I.
Figure 18B:
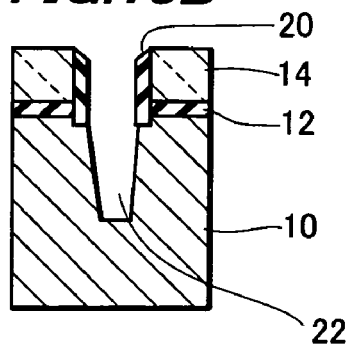

Herein, the step of FIG. 18A is the same as the step of FIG. 1A, and the step of FIG. 18B is the same as the step of FIG. 1D.

Figure 18C:
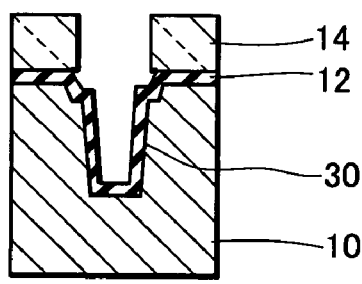

In the step of FIG. 18C, the inner surface of the trench 22 undergoes isotropic oxidation in a state of FIG. 1E (where preferential backing off of the shoulder portion of the trench and rounding of the corner portion is not performed by anisotropic oxidation), and an isotropic oxide film 30 is formed. Then, when the TEOS oxide film 32 is deposited, since the opening of the trench 22 is not broadened nor the shoulder portion of the trench is not rounded, it is not possible to perform excellent embedding of the TEOS oxide film 32 as shown in FIG. 18D.

Figure 18D:
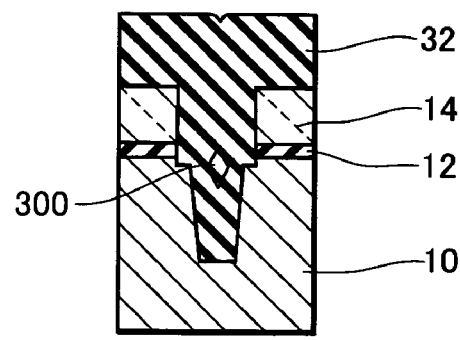

As a result, in FIG. 18D, a void 300 is generated inside the trench 22. For example, when a conductive foreign substance comes into the void 300, and the void 300 exists near the opening of the trench 22, the risk increases that a short circuit occurs in different wiring. Further, when the embedding characteristic of oxide in the trench 22 deteriorates, inconvenience arises that the leak current tends to occur in the shoulder portion of the trench.

Figure 11:
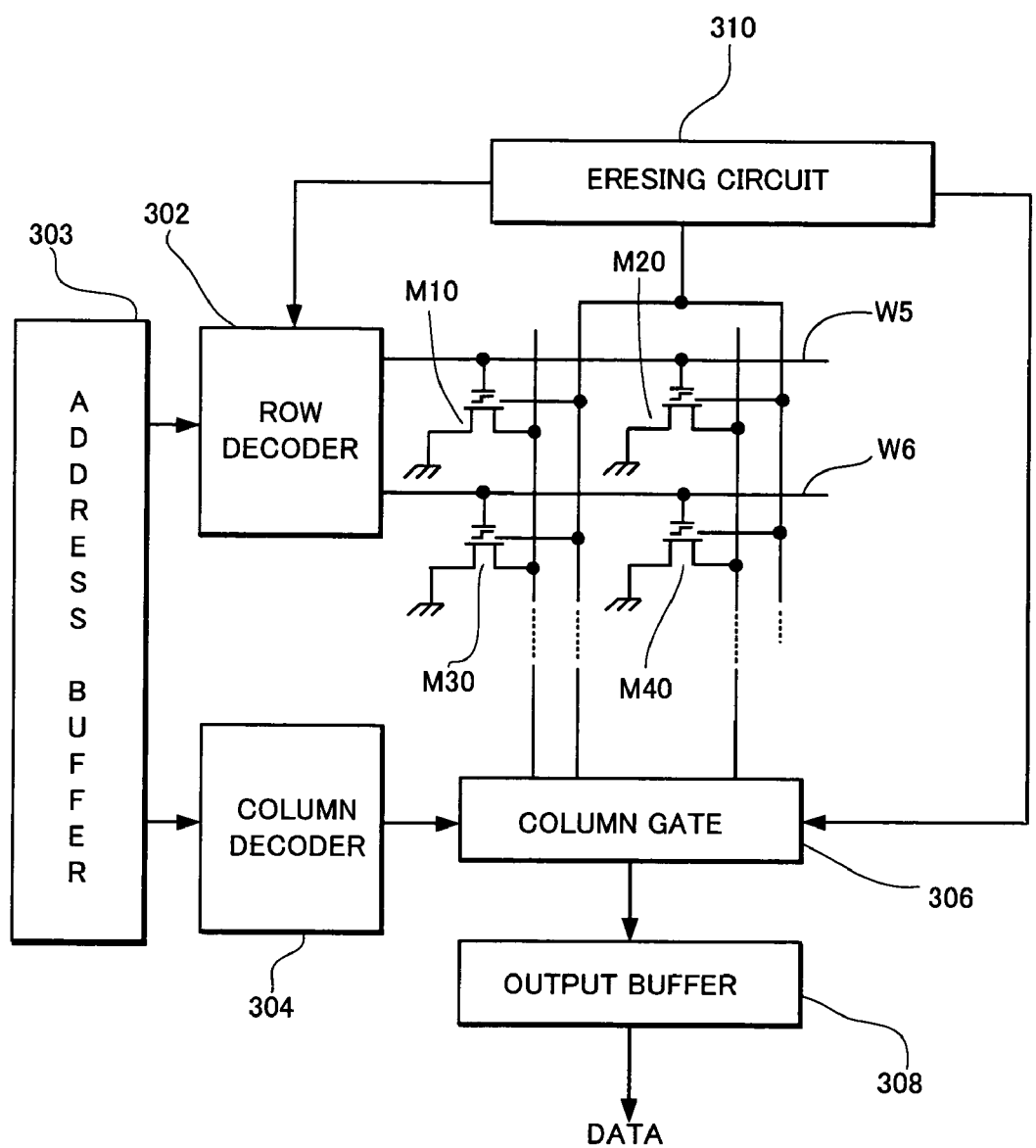
FIG. 11 is a circuit diagram illustrating main part of Flash Memory formed using the method of manufacturing a semiconductor device of the invention.

In contrast thereto, the trench 22 formed through the steps of FIGS. 1A to 1I is excellent in the embedding characteristic of oxide in the trench 22, the flatness of the oxide is assured in the shoulder portion of the trench, and therefore, inconvenience as shown in the comparative example of FIG. 11 does not occur.

Thus, according to the method of forming a trench of the invention, it is possible to make fabrication of a finer trench compatible with suppression of occurrence of foreign substance due to improvement in the insulating film embedding characteristic, concentration of the electric field by rounding the shoulder portion, suppression of the stress, reduction in adverse effect on the conductive layer by protrusion of the trench end portion and the like, and accordingly, a minute semiconductor device with high quality can be manufactured.

The procedures of forming a trench as shown in FIGS. 1A to 1I as described above are summarized as shown in FIG. 4.

Figure 4:
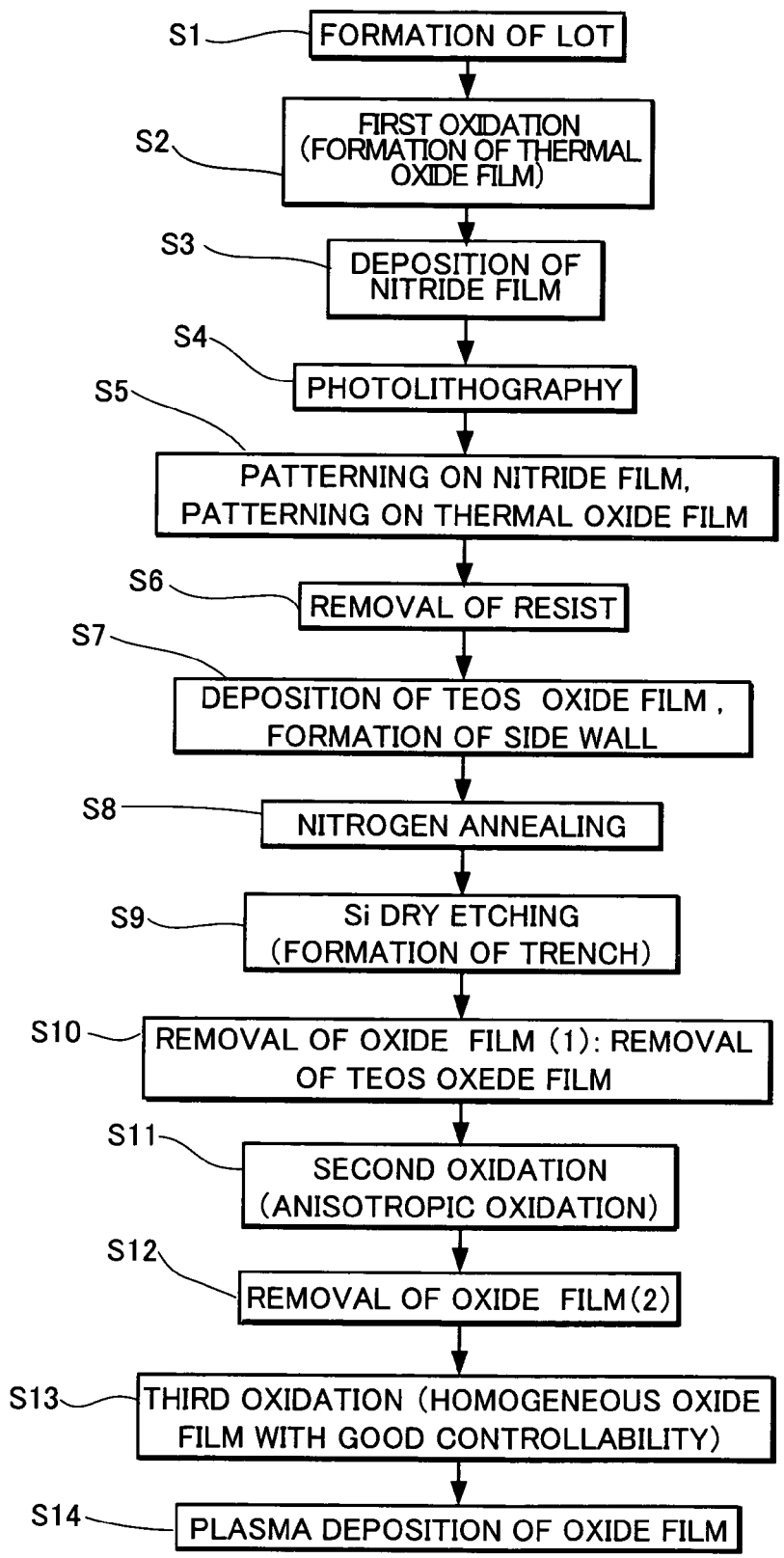
FIG. 4 is a process flow diagram showing primary procedures to form the trench as shown in FIG. 1.

FIG. 4 is a process flow diagram showing primary procedures to form the trench as shown in FIG. 1.

As shown in FIG. 4, first, a semiconductor wafer (semiconductor substrate 10) is prepared (step S1), the thermal oxide film 12 is formed on the surface of the silicon wafer 10 by first oxidation (step S2: first oxidation), and subsequently, a silicon nitride film is deposited (step S3). Then, the photoresist film 16 is formed and processed (step S4).

Next, patterning is performed on the nitride film 14 by dry etching, and subsequently, patterning is performed on the thermal oxide film 12 (step S5). Then, the photoresist 16 is removed (step S6).

Next, the TEOS oxide film 18 is deposited, the side wall is formed by performing processing by RIE (step S7), and nitrogen annealing is performed (step S8).

Subsequently, the silicon substrate 10 is dry-etched, and the trench 22 is formed (step S9). Next, the TEOS oxide film (side wall) 20 is removed (step S10: first removal of the oxide film), and the anisotropic oxide film (sacrifice oxide film with anisotropy) 26 is formed using oxidation with anisotropy (oxidation using DCE and the like) (step S11: second formation of the oxide film).

At this point, it is desirable to form an anisotropic oxide film such that the thickness is thick in the shoulder portion, decreases gradually nearer the bottom, and thus, is varied with the portion. Then, the anisotropic oxide film 26 is removed (step S12: second removal of the oxide film). By this means, the shoulder portion is backed off, and the corner portion is rounded. Further, when such an anisotropic oxide film is removed that the thickness is thick in the shoulder portion, decreases gradually nearer the bottom, and thus, is varied with the portion, the side wall of the trench has a forward-tapered shape. Performing forward-taper processing on the side wall of the trench is effective in improving the embedding characteristic of oxide in the trench. Accordingly, it is desirable to perform the forward-taper processing on the trench.

Subsequently, isotropic oxidation (In situ steam generation) oxidation is caused inside the trench 22 to form a film with the uniform thickness, high controllability and good quality (step S13: third oxidation).

Then, by plasma CVD, the TEOS film 32 or the like is deposited on the silicon substrate 10 and in the trench 22 (step S14).

Referring to FIG. 2, described next is procedures for manufacturing a semiconductor device subsequent to the step (i) of FIG. 1. Described herein is the case of manufacturing an insulating gate type field-effect transistor (MOS transistor).

Figure 2A:
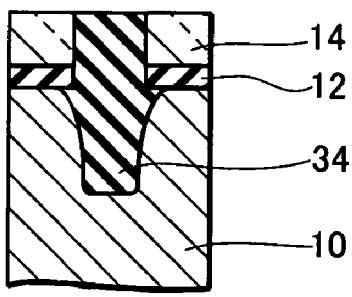
FIGS. 2A to 2H are cross-sectional views of a device for each primary step to explain an example of a method of manufacturing a semiconductor device subsequent to the step of FIG. 1I.
Figure 2E:
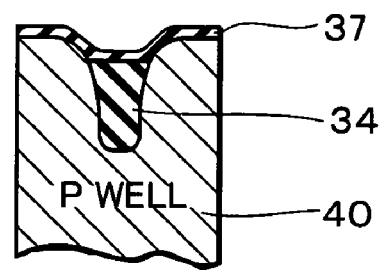
Figure 2B:
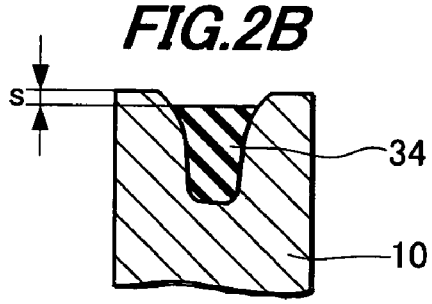
Figure 2F:
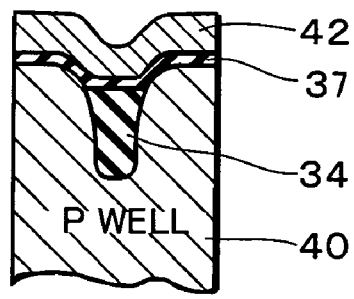
Figure 2C:
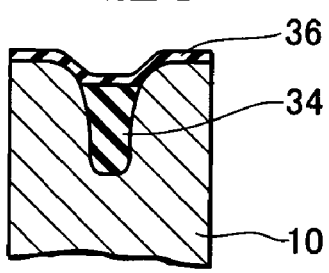
Figure 2G:
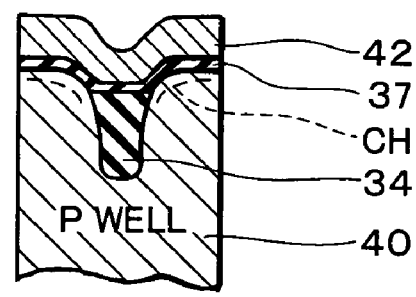
Figure 2D:
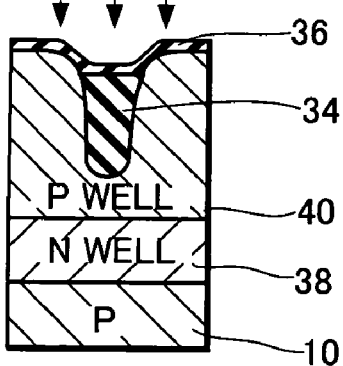
Figure 2H:
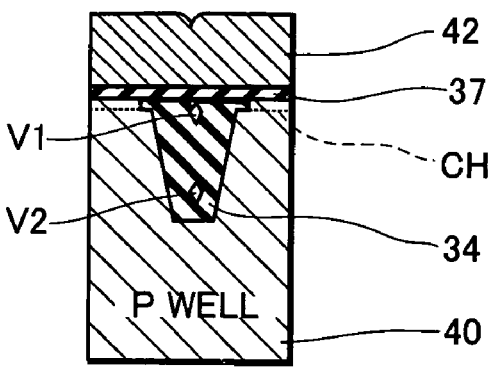

FIGS. 2A to 2F are cross-sectional views of a device for each primary step to explain procedures for manufacturing a semiconductor device subsequent to the step of FIG. 1I, and FIG. 2H is a cross-sectional view of a device of a comparative example.

The TEOS oxide film 32 deposited on the silicon substrate 10 and in the trench 22 in the step of FIG. 1I is polished by Chemical Mechanical Polish (CMP) until the surface of the silicon nitride film 14 is exposed. Thereafter, a polished TEOS oxide film is assigned reference numeral 34.

Next, as shown in FIG. 2B, the silicon nitride film 14 is removed, and then, wet etching is performed to remove the silicon oxide film 12 on the surface of the silicon substrate 10 and an upper portion of the TEOS oxide film 34 in the trench. At this point, as shown in the figure, the position of the upper surface of the TEOS film (embedded oxide) 34 embedded in the trench 22 is made lower than the surface (the position of the opening) of the trench 22.

In FIG. 2B, the position of the upper surface of the embedded oxide (TEOS film) 34 embedded in the trench 22 is located lower than the position of the opening of the trench 22 by a distance "S". In other words, the embedded oxide (TEOS film) 34 is formed to be lower than the opening of the trench 22. The reason for such formation is to enable the rounded shoulder portion of the trench and vicinity thereof to be used as a channel region of the MOS transistor (described later).

Next, as shown in FIG. 2C, a mask member (not shown in Figs.) for ion implantation is formed on a insulator member 36 on the surface of the semiconductor substrate 10.

Then, as shown in FIG. 2D, ion implantations of phosphorus (P) and boron (B) are performed, and N-well 38 and P-well 40 are formed by performing annealing by heat treatment.

Next, as shown in FIG. 2E, after removing the mask member, a gate insulating film 37 is formed.

Then, as shown in FIG. 2F, a gate electrode layer 42 is provided. As the gate electrode layer 42, for example, a polysilicon electrode doped with phosphorus (P Doped Poly-Si: D-Poly) is used. Further, polysilicide such as WSi, CoSi and the like may be laminated. Herein, what is noted is that the gate electrode layer 42 sinks slightly on the trench 22 because the TEOS oxide film 34 is embedded lower in the trench 22.

By this means, as shown in FIG. 2G, when the voltage is applied to the gate electrode layer 42, channel CH (shown by the dotted line in the figure) is induced also on the surface of the semiconductor substrate 10 in the rounded shoulder portion of the trench 22 and vicinity thereof. In other words, by enabling formation of the channel along the rounded corner portion of the trench 22, the gate width (W) of the MOS transistor expands, the channel conductance (W/L: L is the channel length) of the MOS transistor increases, and it is made possible to suppress the decreases in the current capability of the minute MOS transistor.

In other words, according to the method of manufacturing a semiconductor device of the invention, it is possible to achieve STI embedding with void-free and assurance of the required current driving capability of the MOS transistor by the increase in the channel conductance (W/L), without inhibiting fine processing of the device. This respect will more specifically be described later with reference to FIG. 7.

FIG. 2H shows a cross-sectional view of the device where the processing is performed for embedding the deposited TEOS oxide film in the trench (as in the conventional case) subsequent to the step (d) of the comparative example as shown in FIG. 18, and the gate oxide film 37 and gate electrode layer 42 are formed.

In FIG. 2H, the embedding characteristic deteriorates for embedding the TEOS oxide film 34 in the trench, voids V1 and V2 occur, and in response to the positions of the voids V1 and V2, the center portion of the gate electrode layer 42 sinks slightly. Since the shoulder portion of the trench 22 cannot be used effectively as the channel region (CH) of the MOS transistor, it is not possible to expand the channel width W.

Thus, according to the method of manufacturing a semiconductor device of the invention, it is possible to implement uniform embedding of the insulating film in the trench, assurance of flatness in the shoulder portion of the trench, and assurance of formation of a gate oxide film with good quality. Further, it is possible to use the rounded shoulder portion of the trench and vicinity thereof as a channel region of the MOS transistor, and it is thereby possible to increase the gate width (W) of the MOS transistor, further increase the channel conductance (W/L: L is the channel length), and suppress the reduction in the current capability of the MOS transistor due to fine patterning.

The procedures for manufacturing a semiconductor device as shown in FIGS. 2A to 2G as described above are summarized as in FIG. 5.

Figure 5:
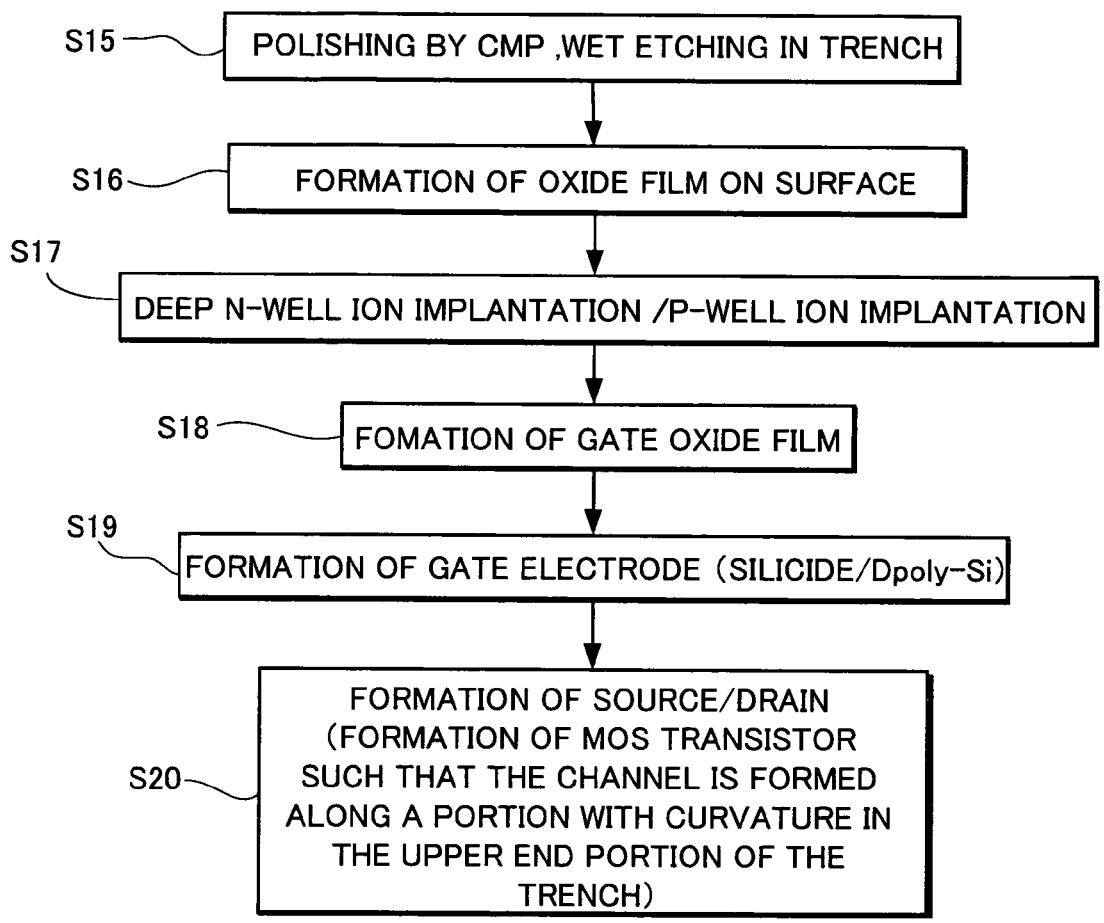
FIG. 5 is a process flow diagram showing primary procedures to manufacture the semiconductor device as shown in FIG. 2.

FIG. 5 is a process flow diagram showing primary procedures to manufacture the semiconductor device as shown in FIG. 2.

First, the deposited TEOS film 32 (FIG. 1I) is polished by CMP, the silicon nitride 14 is removed, wet etching (etching back) is then performed on the embedded TEOS oxide film 34, and in this step, over-etching is intentionally performed so that the position of the surface of the embedded oxide film 34 is lower than the position of the opening of the trench 22 (step S15).

Subsequently, the mask member is formed (step S16) the N-well 38 and P-well 40 are next formed by ion implantation (step S17), the gate oxide film 36 is then formed (step S18), and the gate electrode layer (WSi/D-Poly) is formed (step S19).

Then, the source and drain of the MOS transistor are formed (step S20). In this way, the MOS transistor is formed such that the channel is formed along the rounded portion (having curvature) of the upper end portion (shoulder portion) of the trench.

Embodiment 2

This Example describes an example of forming an isotropic oxide film ($SiO_2$) and silicon nitride film (SiN) in the trench.

It is a feature of this Example that after an isotropic oxide film is formed in the trench, a thin silicon nitride film 31 is formed on the surface of the isotropic oxide film, and embedding of the trench is then performed.

The silicon nitride film acts to prevent the occurrence of a situation that the oxide film on the surface of the trench is supplied with oxygen from the embedded oxide film (TEOS oxide film) and grows (expands) unnecessarily in performing heat treatment in subsequent steps.

When the oxide film on the surface of the trench expands even slightly, the width of the trench increases, and such fears arise that the stress between the silicon substrate and oxide film increases to increase the interface state density, and that the leak current increases. Therefore, the nitride film is provided as a buffer between the embedded oxide film (TEOS oxide film) and the oxide film on the inner surface of the trench to interrupt movement of oxygen. Further, the nitride film also serves a function of preventing damage to the surface of the silicon substrate in embedding the oxide film (TEOS oxide film) in the trench.

Further descriptions are given below.

FIGS. 3A to 3H are cross-sectional views of a device for each primary step to explain another example (an example for forming an isotropic oxide film and silicon nitride film in a trench) of the method of manufacturing a semiconductor device of the invention. In FIG. 3, portions common to FIG. 1 are assigned the same reference numerals.

Figure 3A:
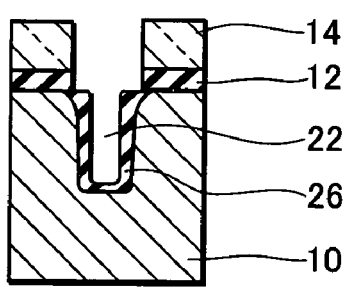
FIGS. 3A to 3H are cross-sectional views of a device for each primary step to explain another example (an example for forming an isotropic oxide film and silicon nitride film in a trench) of the method of manufacturing a semiconductor device of the invention.

As shown in FIG. 3A, the anisotropic oxide film 26 is formed in the trench 22.

Figure 3B:
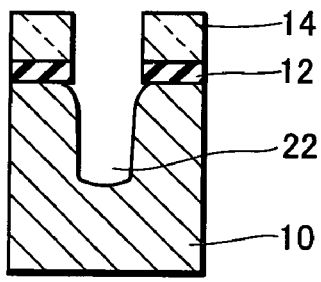

Then, as shown in FIG. 3B, the anisotropic oxide film 26 is removed. By this means, the shoulder portion of the trench is backed off greatly, and at the same time, rounded.

Figure 3C:
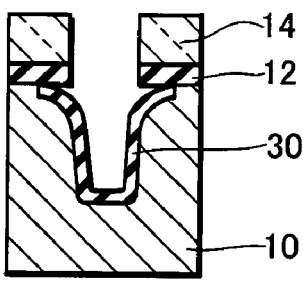

Next, as shown in FIG. 3C, isotropic oxidation (for example, $O_2$ plasma oxidation) is carried out to form the isotropic oxide film 30 with good quality on the inner surface of the trench 22.

Figure 3D:
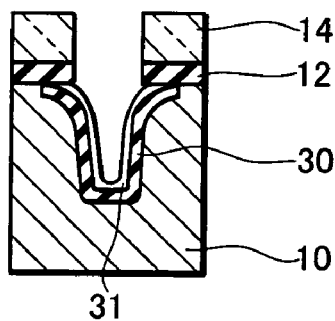

Subsequent steps are the same as the steps of FIGS. 1F to 1H. Next, for example, a thin silicon nitride film (SiN or SiON) with a thickness of about 10 nm is formed as shown in FIG. 3D.

Figure 3E:
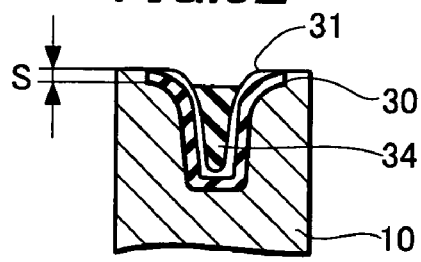

Next, as shown in FIG. 3E, the TEOS oxide film 34 is embedded in the trench 22. In other words, the TEOS oxide film is formed to fill the trench 22, and is polished by CMP, the silicon nitride film 14 is removed, and then, the oxide film undergoes wet etching. In this way, the embedded oxide film 34 is obtained as shown in FIG. 3E. As in the Example described previously, the surface of the embedded oxide film 34 is located in a position lower than the surface of the trench by the distance S.

Figure 3F:
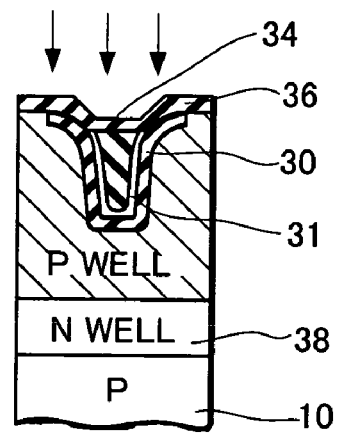

Next, as shown in FIG. 3F, after the mask for ion implantation is formed on the semiconductor substrate, ion implantation is performed, and heat treatment is carried out to form the P-well and N-well. By the heat treatment in this step, oxygen tries to move from the embedded oxide film 34 to the isotropic oxide film 30 on the surface of the trench, but since the silicon nitride film 31 is formed as a buffer layer, such movement of oxygen is prevented. By this means, the isotropic oxide film 30 is prevented from growing (expanding) unnecessarily.

When the oxide film on the surface of the trench expands even slightly, the width of the trench increases, and such fears arise that the stress between the silicon substrate and oxide film increases to increase the interface state density, and that the leak current increases, but in this Example, there is no concern about such inconvenience occurring. Further, the nitride film also serves the function of preventing damage to the surface of the silicon substrate in embedding the oxide film (TEOS oxide film) in the trench, and therefore, in this Example, the capability of preventing damage is enhanced more than the Embodiment as described previously.

Figure 3G:
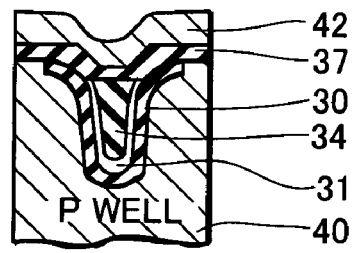

Subsequently, after the mask for ion implantation is removed, gate oxidation is caused to form the gate insulating film 37, and the gate electrode layer 42 is further formed (FIG. 3G). Then, the source/drain layer is formed (not shown in the figure).

Figure 3H:
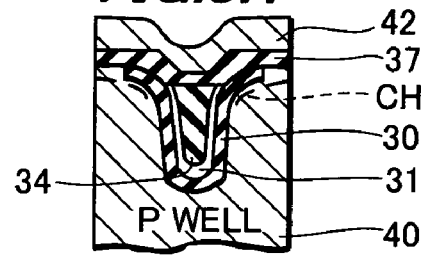

Then, when the voltage is applied to the gate electrode layer 42, as shown in FIG. 3H, the channel is induced also in the rounded shoulder portion of the trench, thereby preventing decreases in the current capability of the MOS transistor.

Embodiment 3

With reference to FIGS. 6 to 10, this Example describes the feature (such that the channel conductance can be increased in the MOS transistor) of a semiconductor device formed by using the method of forming a trench and the method of manufacturing a semiconductor device of the present invention, and specific examples of the semiconductor device.

Figure 6:
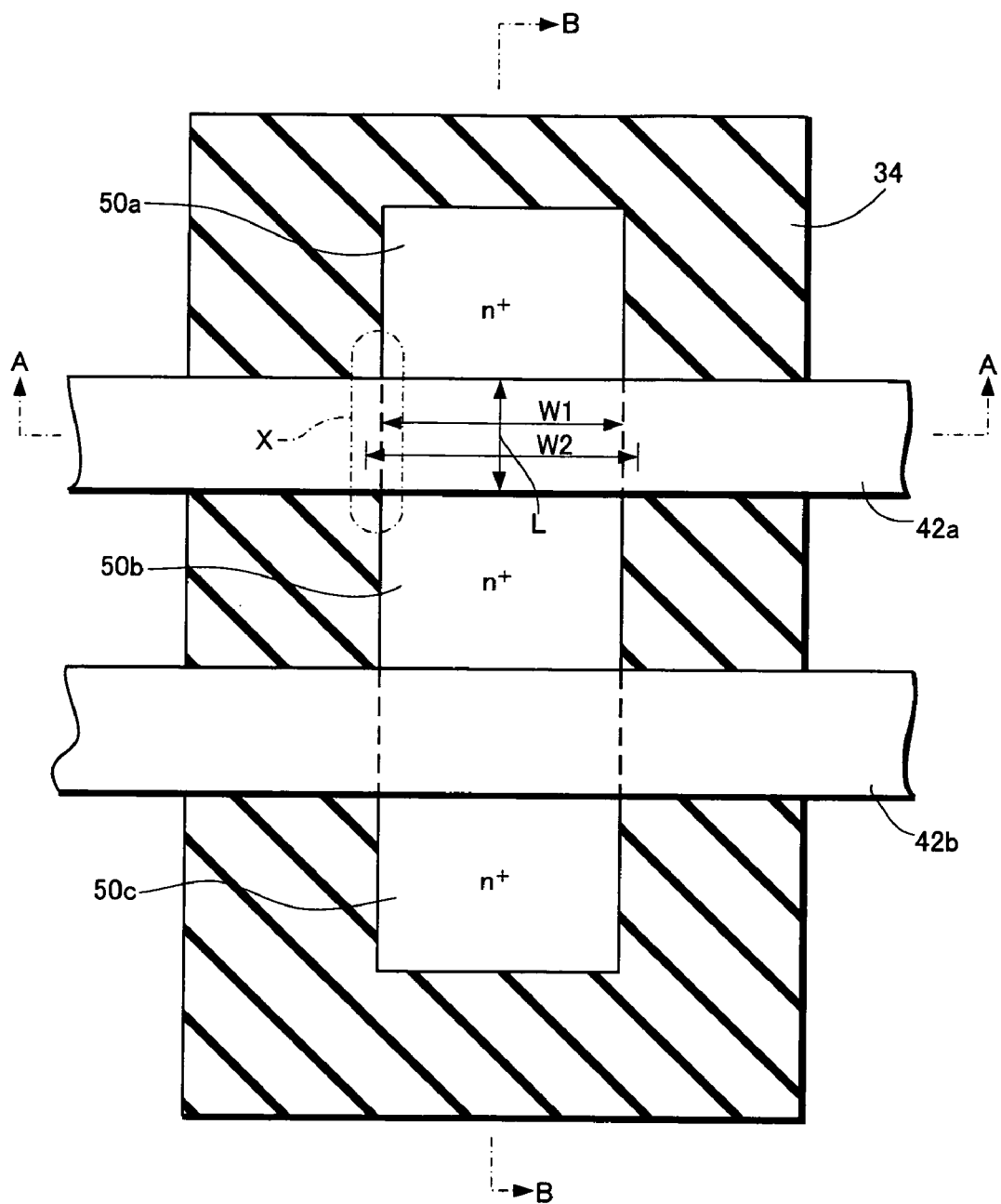
FIG. 6 is a plan view of main part of a semiconductor device with integrated insulating gate type field-effect transistors (MOS transistors) manufactured by the method of forming a trench and the method of manufacturing a semiconductor device of the invention.

FIG. 6 is a plan view of main part of a semiconductor device with integrated insulating gate type field-effect transistors (MOS transistors) manufactured by the method of forming a trench and the method of manufacturing a semiconductor device of the invention. In addition, in the FIG. 6, the same portions as in the drawings described above are assigned the same reference numerals.

In FIG. 6, two n-MOS transistors are formed in a region surrounded by the oxide film 34 (STI) embedded in the trench. In the figure, reference numerals 50a, 50b and 50c denote an $n^+$-type diffusion region (region to be a source/drain), and reference numerals 42a and 42b denote gate electrodes.

Figure 7:
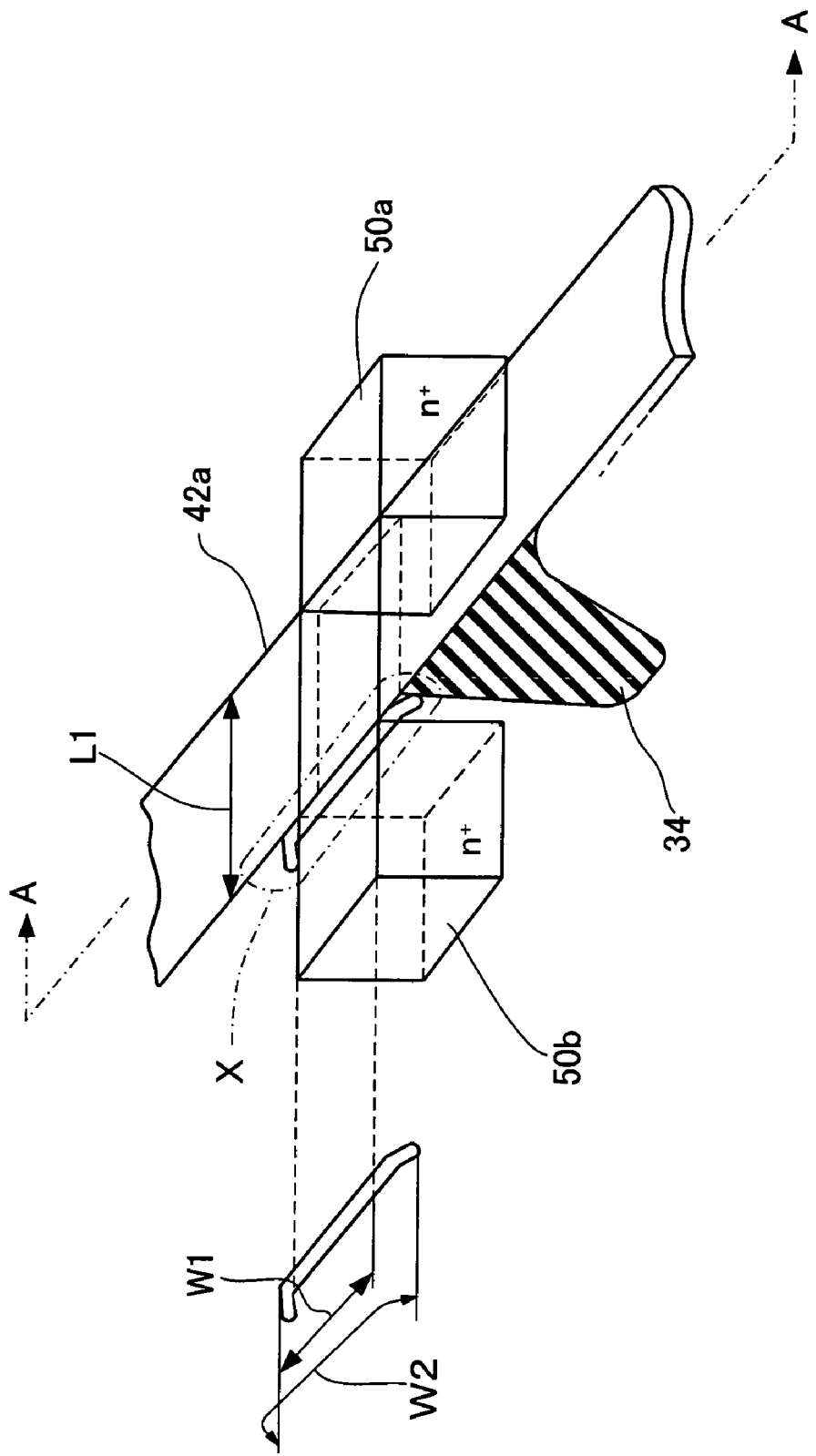
FIG. 7 is a perspective cross-sectional view (including a view showing a shape of a channel near a region X surrounded by the dotted line in FIG. 6) near A-A line of the MOS transistor shown in FIG. 6.

FIG. 7 is a perspective cross-sectional view (including a view showing a shape of a channel near a region X surrounded by the dotted line in FIG. 6) near A-A line of the MOS transistor shown in FIG. 6.

As described in the step of FIG. 2F, in the semiconductor device of the invention, the shoulder portion (preferentially backed and sufficiently rounded shoulder portion) of the trench and vicinity thereof is used as a channel (CH) of the MOS transistor, and the channel width (W) is thereby expanded.

In addition, in the figure of FIG. 2F, a portion of the trench is only drawn. Therefore, in FIG. 7, a structure of the MOS transistor is mainly drawn, and a shape of the channel of the MOS transistor near the trench (STI) is clearly indicated more specifically.

In FIG. 7 (and FIG. 6), "L1" is a channel length of the MOS transistor, "W1" is a gate width of the MOS transistor manufactured by the conventional manufacturing method, and "W2" is a gate length of the MOS transistor manufactured by the manufacturing method of the invention.

On the left side of FIG. 7 is shown a shape in the channel width (W) direction of the channel (CH) of the MOS transistor near the region X surrounded by the dotted line in FIG. 6.

As can be seen from this figure, in the conventional MOS transistor, the channel width is W1. Meanwhile, in the MOS transistor of the invention, since the rounded shoulder portion of the trench (STI) and vicinity thereof is used as the channel (CH), the channel width is expanded to W2.

With progress in fine processing of the MOS transistor, the current driving capability of a single MOS transistor tends to decrease. In the MOS transistor of the invention, the channel conductance (W/L) is increased, while enabling fine processing of the device, and it is possible to prevent the current capability of the MOS transistor from decreasing.

Figure 8:
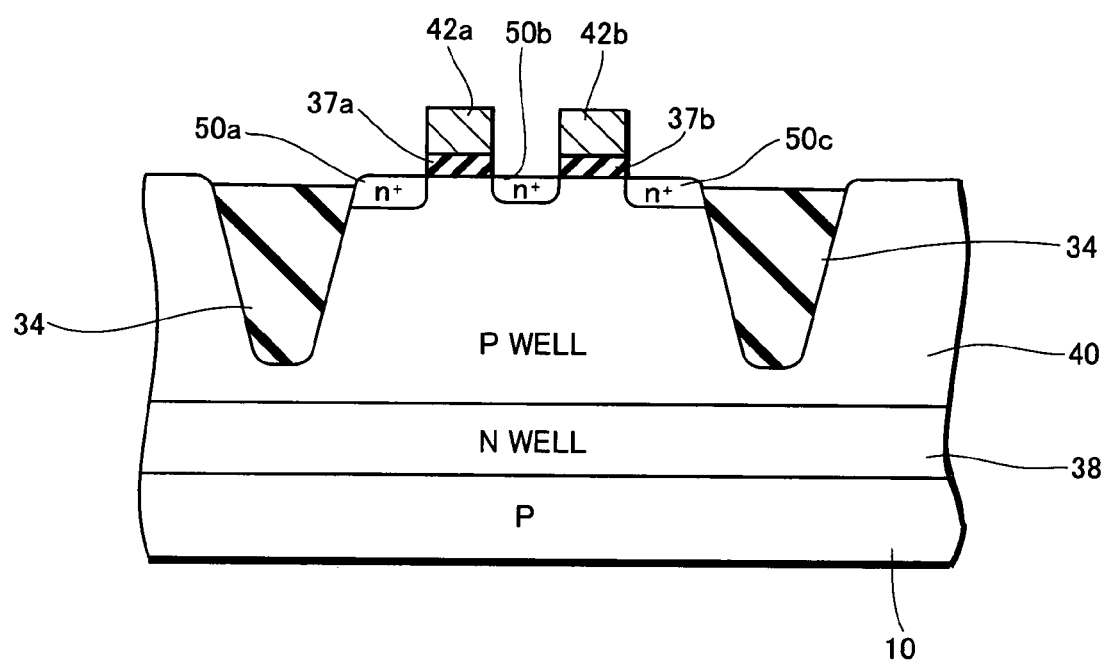
FIG. 8 is a cross-sectional view taken along line B-B of the MOS transistor of FIG. 6.

FIG. 8 is a cross-sectional view taken along line B-B of the MOS transistor of FIG. 6. In FIG. 8, portions common to the figures as described above are assigned the same reference numerals.

As shown in the figure, the N-well 38 and P-well 40 are formed on the P-type semiconductor substrate 10. The shallow trench isolation (STI) region is formed in the P-well 40. Two n-channel MOS transistors are formed in the region surrounded by the STI region.

In the figure, reference numerals 50a, 50b and 50c denote an n+-diffusion region, reference numerals 36a and 36b denote a gate oxide film, and reference numerals 42a and 42b denote a gate electrode layer.

Figure 9:
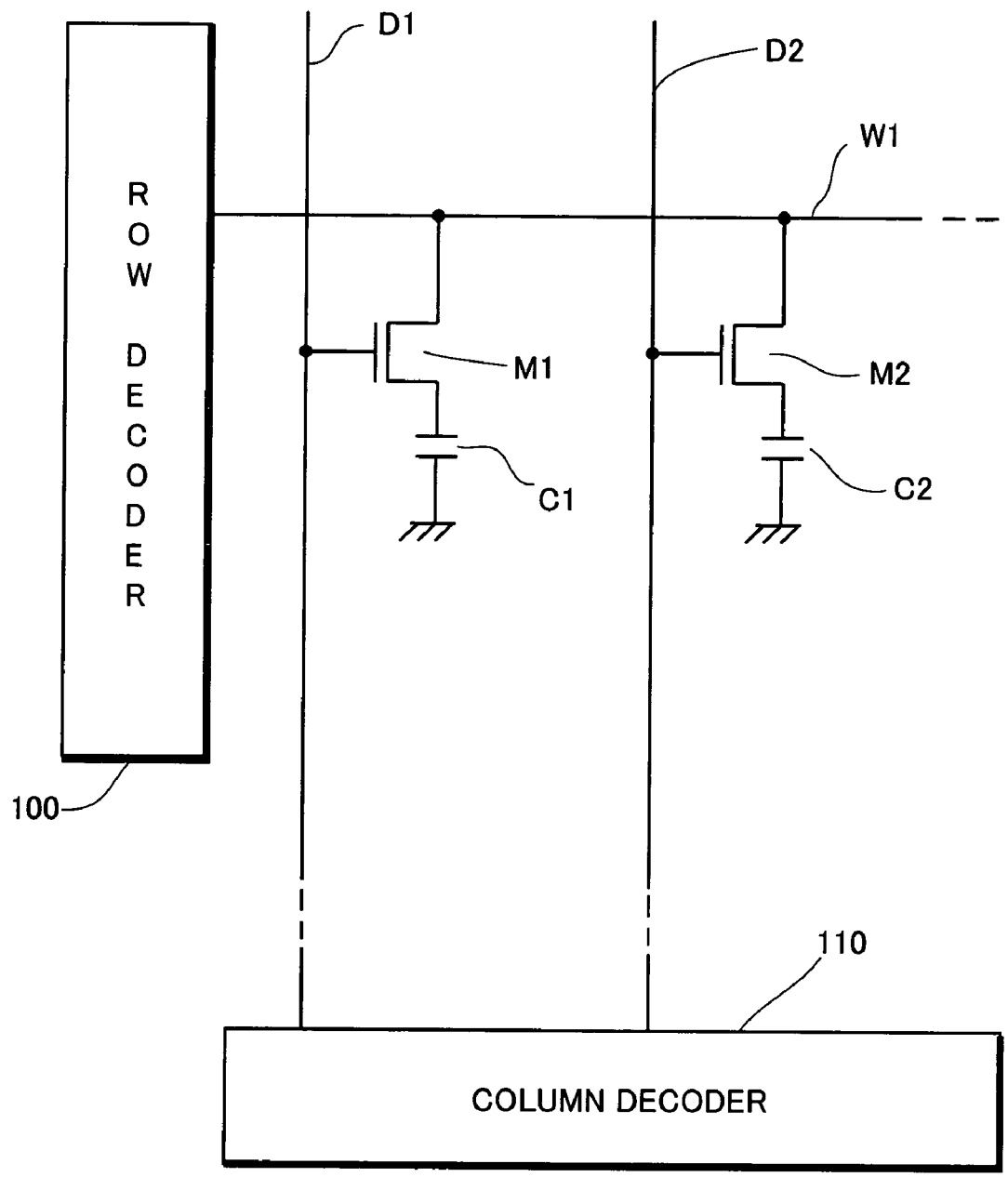
FIG. 9 is a circuit diagram illustrating a basic structure of DRAM.

When capacitors and wiring layers to be word lines and data lines are formed in the semiconductor substrate 10 as well as the MOS transistors, DRAM as shown in FIG. 9 can be configured.

FIG. 9 is a circuit diagram illustrating a basic structure of DRAM.

A memory cell of DRAM is comprised of an MOS transistor M1 (M2) and capacitor C1 (C2). In the figure, W1 is a word line, and D1 and D2 are data lines. Further, reference numeral 100 denotes a row decoder constituting an address circuit, while reference numeral 110 denotes a column decoder constituting a sense circuit.

In the MOS transistor manufactured by the method of manufacturing a semiconductor device of the invention, reduction in current capability is compensated. Further, a minute trench can be formed, the characteristic is excellent for embedding the oxide in the trench, and it is thus possible to obtain DRAM with a high degree of integration, high performance and high reliability.

The present invention is capable of being used in manufacturing of nonvolatile memory such as PROM, EPROM and the like, as well as DRAM, and further, usable in manufacturing of a bipolar transistor where element isolation is performed by STI (Shallow Trench Isolation)

Embodiment 4

Figure 10:
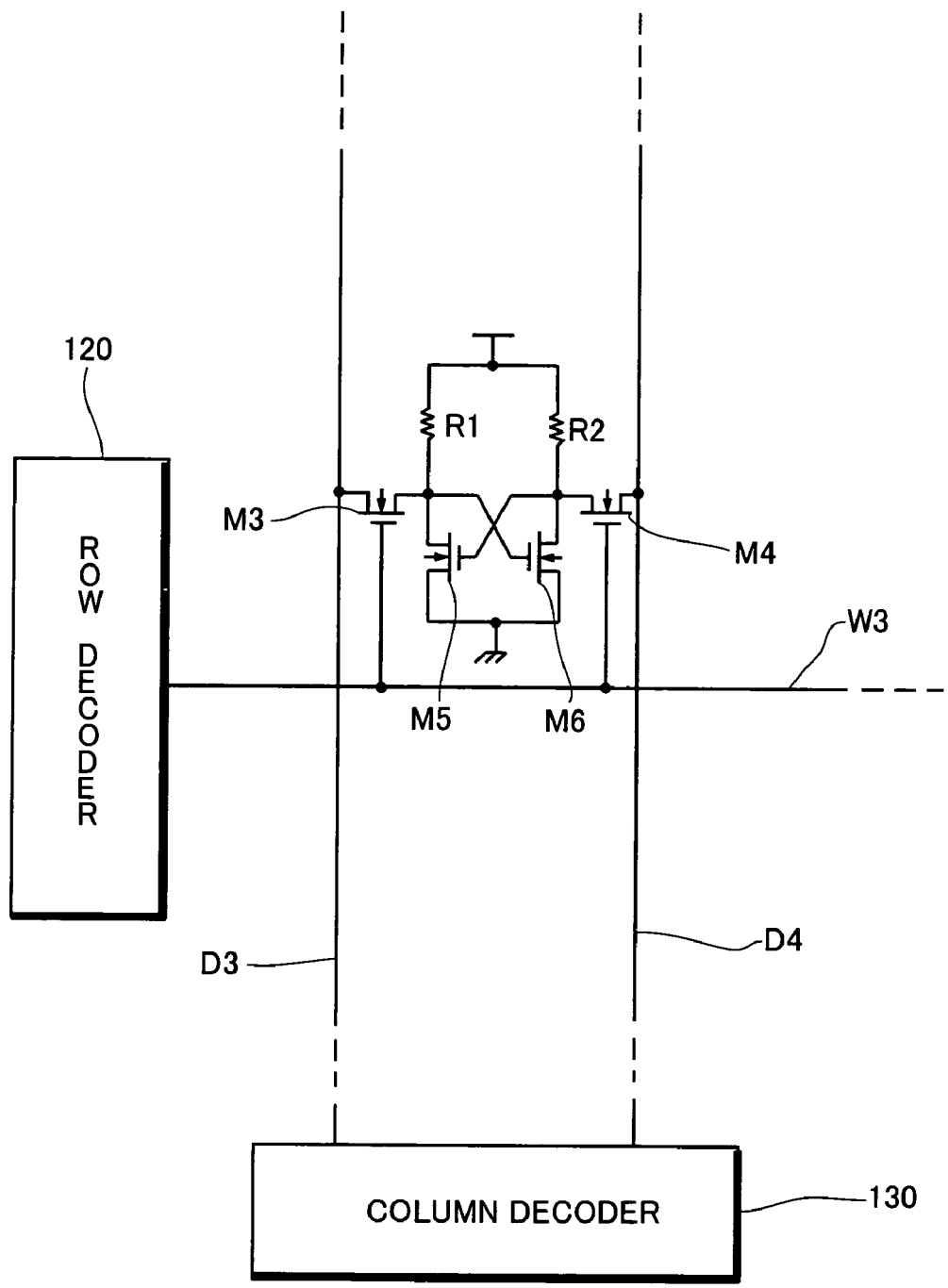
FIG. 10 is a circuit diagram illustrating main part of SRAM formed using the method of manufacturing a semiconductor device of the invention.

FIG. 10 is a circuit diagram illustrating main part of SRAM formed using the method of manufacturing a semiconductor device of the invention;

A memory cell of SRAM is comprised of high-resistance loads R1 and R2, MOS transistors M5 and M6 constituting a transfer gate, and MOS transistors M5 and M6 constituting a flip-flop.

In the figure, W3 is a word line, and D3 and D4 are data lines. Further, reference numeral 120 denotes a row decoder constituting an address circuit, while reference numeral 130 denotes a column decoder constituting a sense circuit.

In the MOS transistor manufactured by the method of manufacturing a semiconductor device of the invention, reduction in current capability is compensated. Further, a minute trench can be formed, the characteristic is excellent for embedding the oxide in the trench, and it is thus possible to obtain SRAM with a high degree of integration, high performance and high reliability.

In addition, as a memory cell of SRAM, for example, a memory cell using six transistors, or a memory cell using ten transistors can be adopted.

Embodiment 5

FIG. 11 is a circuit diagram illustrating main part of Flash Memory formed using the method of manufacturing a semiconductor device of the invention;

A memory cell of Flash Memory comprised MOS transistors (M10 to M40 and the like) having two gates, floating gate and control gate.

In the figure, W5 and W6 are word lines, and D5 and D6 are data lines. Further, reference numeral 303 denotes an address buffer, reference numeral 302 and 304 respectively denote a row decoder and a column decoder. Reference numerals 306, 308 and 310 respectively denote a column gate, output buffer and erasing circuit.

In the MOS transistor manufactured by the method of manufacturing a semiconductor device of the invention, reduction in current capability is compensated. Further, a minute trench can be formed, the characteristic is excellent for embedding the oxide in the trench, and it is thus possible to obtain Flash Memory with a high degree of integration, high performance and high reliability.

Embodiment 6

Figure 12:
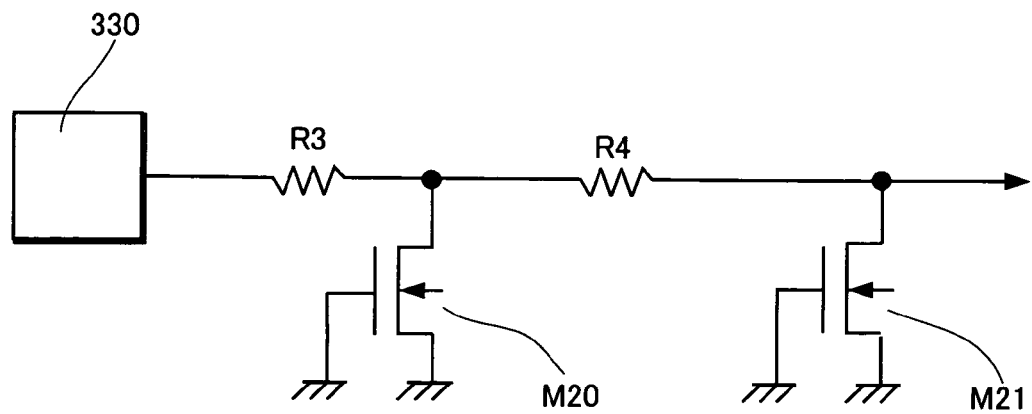
FIG. 12 is a circuit diagram of an input protection circuit configured using MOS transistors manufactured by the method of manufacturing a semiconductor device of the invention.

FIG. 12 is a circuit diagram of an input protection circuit configured using MOS transistors manufactured by the method of manufacturing a semiconductor device of the invention.

In the figure, reference numeral 330 denotes an input pad, R3 and R4 are resistance, and M20 and M21 are diodes using MOS transistors (that are manufactured by the method of manufacturing a semiconductor device of the invention) which serve to flow a surge current into the ground when excessive voltage is applied to the input pad 330.

The MOS transistors manufactured by the method of manufacturing a semiconductor device of the invention are compensated for reduction in current capability, able to flow a large surge current into the ground instantaneously, and can thus be used in forming an input protection circuit.

Embodiment 7

Figure 13:
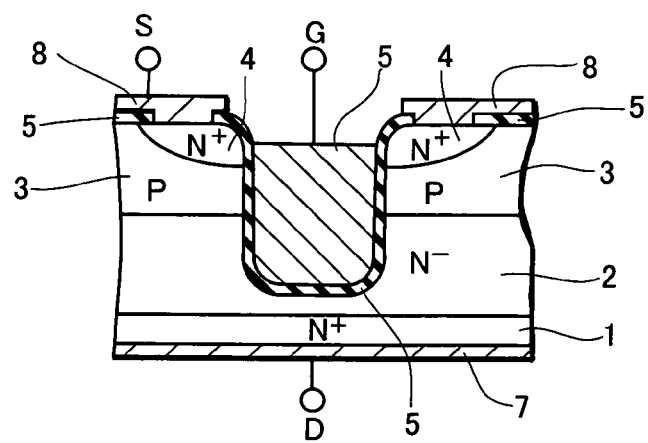
FIG. 13 is a cross-sectional view of a device showing a structure of a vertical type power MOS transistor (element transistor) with a trench gate using the trench formed by the method of forming a trench of the invention.

FIG. 13 is a cross-sectional view of a device showing a structure of a vertical type power MOS transistor (element transistor) with a trench gate using the trench formed by the method of forming a trench of the invention;

The vertical type power MOS transistor with a trench gate is manufactured through following steps.

In other words, an N-type epitaxial layer 2 is formed on an N-type substrate 1, a P-type base 3 is formed on the epitaxial layer 2, and a source layer (N-type layer) 4 is formed on the surface of the P-type base 3.

Next, a trench is formed to penetrate the center portion of the source layer 4, and a shoulder portion of the trench is greatly backed off and rounded by formation and removal of the anisotropic sacrifice oxide film as described previously.

Then, the inside of the trench undergoes isotropic oxidation, a gate oxide film 5 is thus formed on the inner surface of the trench, and subsequently, metal material (d-poly Si and the like) 6 to be a gate electrode is embedded in the trench 6. A source electrode 8 and drain electrode 7 are then formed.

In embedding the metal material (d-poly Si and the like) 6 to be a gate electrode in the trench, since the shoulder portion of the trench is backed off and the inlet is broadened, the excellent embedding characteristic is achieved. Further, since the shoulder portion (corner portion) of the trench is sufficiently rounded, the gate insulating film 5 with good quality can be formed with stability, and concentration of electric field in the source layer 4 is relieved.

Embodiment 8

In the foregoing, the case of using the trench as isolation is described as an example, but the invention is not limited to such a case. For example, the technique of forming a trench of the invention is applicable to a case of forming a capacitor (formation of a trench capacity) using a trench.

Figure 14:
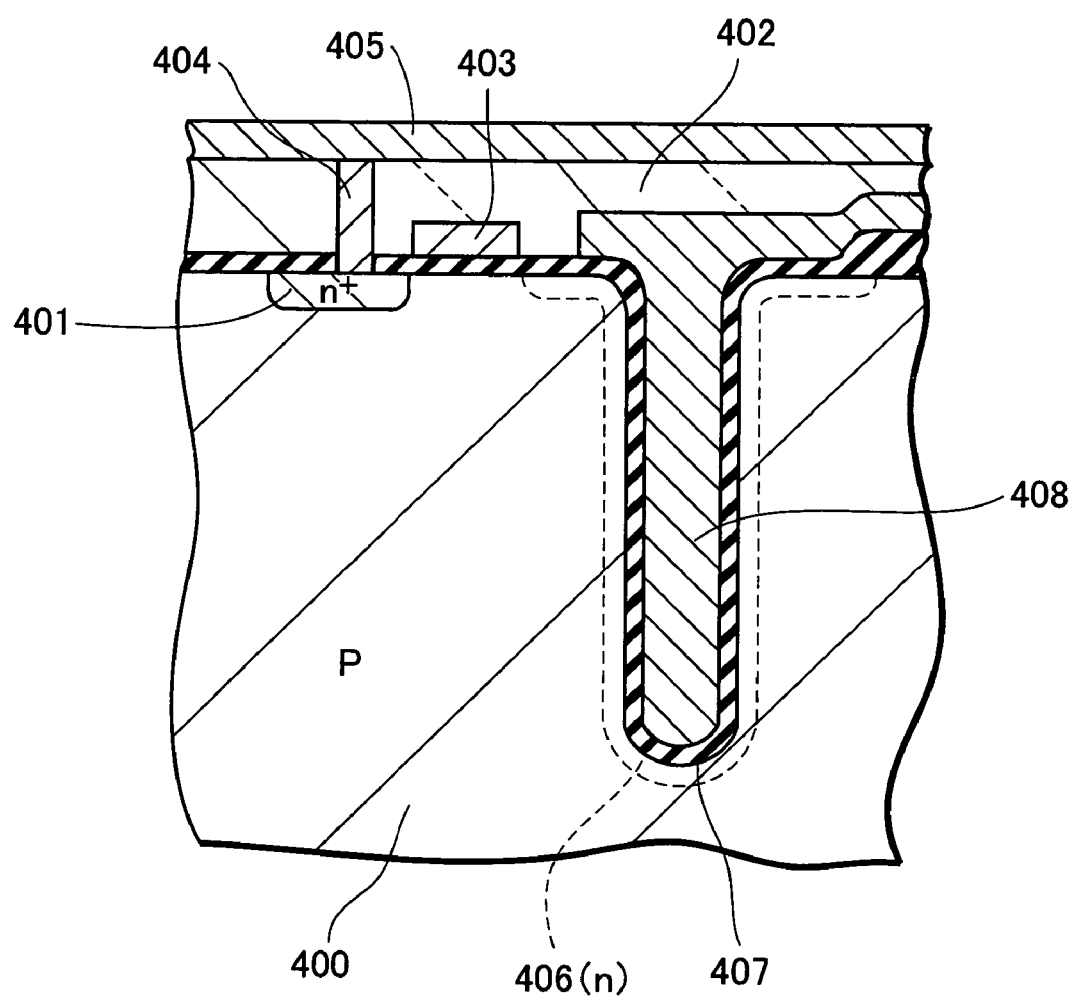
FIG. 14 is a cross-sectional view of a MOS device having a trench capacitor formed using the method of forming a trench of the invention.

FIG. 14 is a cross-sectional view of a MOS device having a trench capacitor formed using the method of forming a trench of the invention.

The MOS device of FIG. 14 is a DRAM cell comprising MOSFET and trench capacitor (MOS capacitor). In the figure, reference numeral 400 denotes a P-type semiconductor substrate, "401" denotes an N-type region, "402" denotes an interlayer insulating film, "403" denotes a gate (word line) of a MOSFET, reference numeral 404 denotes a connection plug, and reference numeral 405 denotes a bit line.

Further, coupled to the MOSFET is formed a trench (such that the inlet is broadened and the corner portion is rounded by removal of the anisotropic sacrifice oxide film) formed by the method of forming a trench of the invention. The inner surface of the trench is covered with a capacitor film 407 (such as a polysilicon film, isotropic oxide film and the like). Then, the trench is filled with a capacitor plate (metal electrode layer) 408. Further, an N-type cathode region (cathode) 406 is provided outside the trench.

A trench capacitor that is a structural element of the DRAM memory cell is formed by the cathode 406, capacitor film 407 and capacitor plate 408.

In the trench in FIG. 14, the inlet is broadened and the shoulder portion is rounded by removal of the anisotropic sacrifice oxide film, the surface area of the inner surface is large, and it is thereby possible to reasonably form a capacitor with large capacitance.

Embodiment 9

The present invention is also applicable to manufacturing of a MEMS element obtained by fine processing of silicon.

Figure 15:
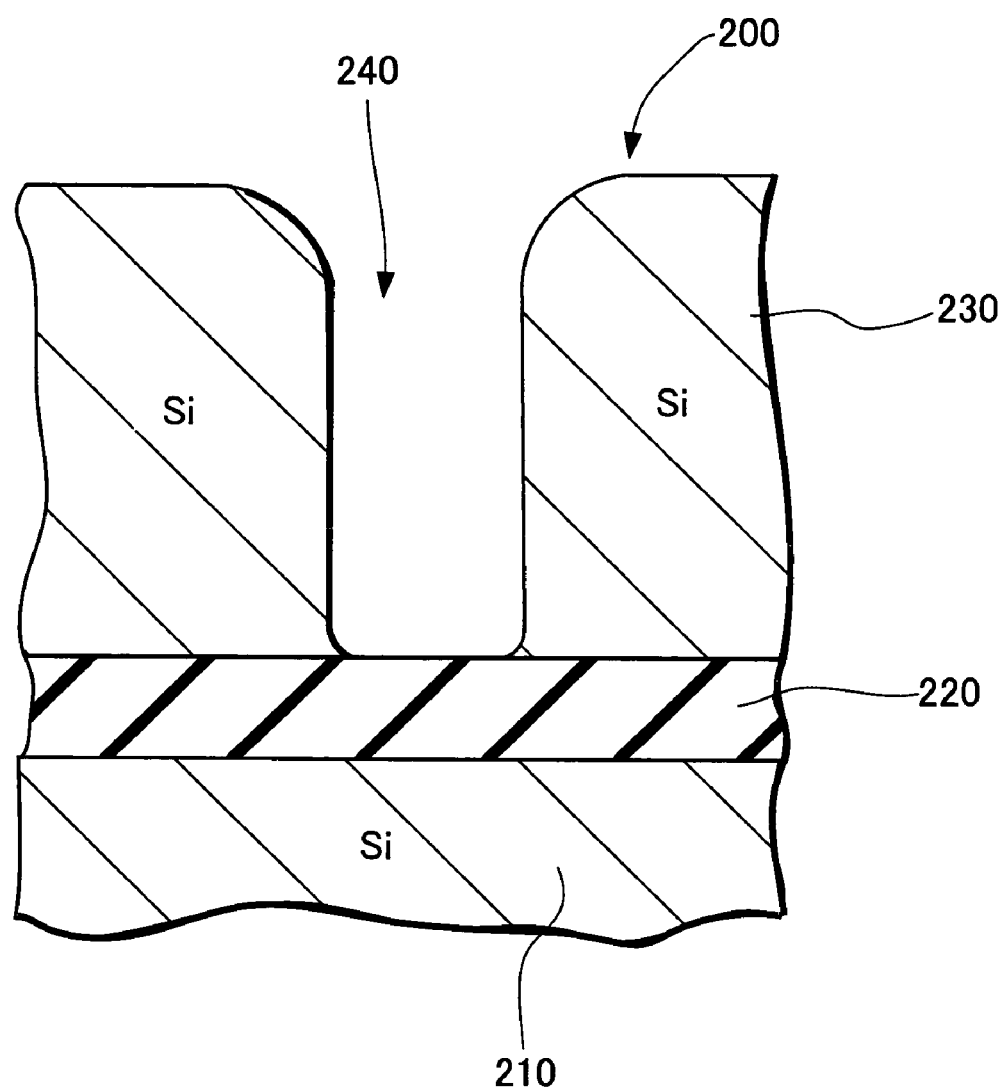
FIG. 15 is a cross-sectional view showing a structure of main part of a MEMS element.

FIG. 15 is a cross-sectional view showing a structure of main part of a MEMS element. A MEMS element 200 as shown in FIG. 15 is a three-dimensional electronic device formed using the SOI (Silicon On Insulator) technique.

In FIG. 15, reference numeral 210 denotes a silicon substrate as a primary layer, reference numeral 220 denotes an insulating film, reference numeral 230 denotes a silicon island formed on the insulating film 220, and reference numeral 240 denotes a trench to isolate the silicon island from air.

In FIG. 15, in forming the trench 240, the method of forming a trench of the invention as shown in FIG. 1 is used, and the rounding processing is performed on the shoulder portion of the trench.

The trench capacitor as shown in FIG. 15 has a forward tapered shape, and rounded shoulder portion, where the surface area inside the trench is larger than that of the general trench. Accordingly, it is possible to form a trench capacitor with large capacitance.

Further, since the embedding characteristic of the insulation film (oxide film) in the trench is excellent, it is possible to form a trench capacitor with good quality.

Embodiment 10

The foregoing is described in the term of formation of a trench (groove), but forming a trench is equivalent to selectively processing a semiconductor substrate, and therefore, the method of forming a trench of the invention is naturally usable as a method of processing a semiconductor substrate.

In other words, a semiconductor substrate is processed by the method of forming a trench of the invention, and as a result of the processing, it is possible to form a three-dimensional structure with a corner portion rounded.

Figure 16A:
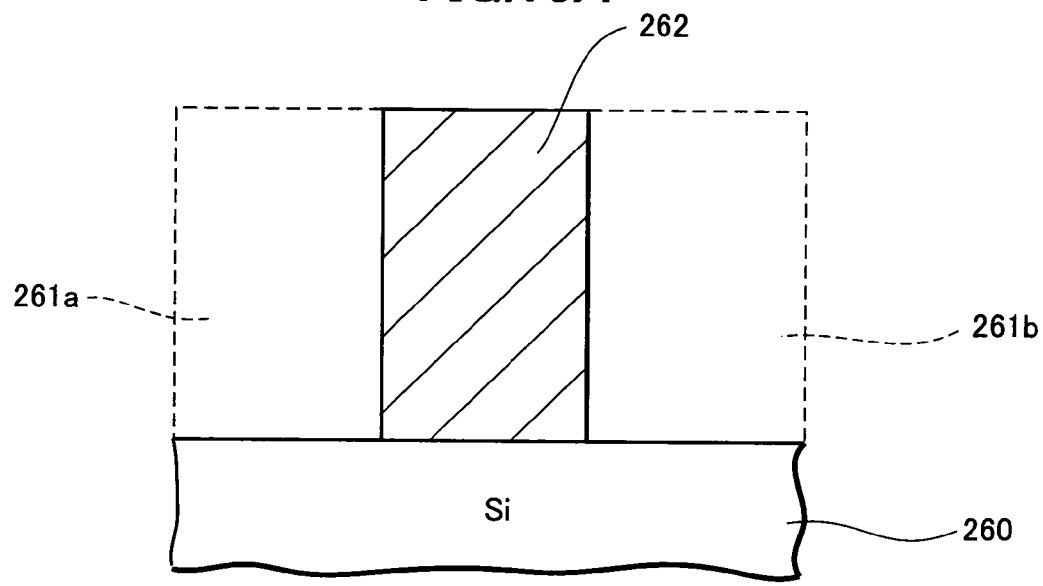
FIGS. 16A and 16B are cross-sectional views of a device for each primary manufacturing step in the case where a semiconductor substrate is processed using the method of forming a trench of the invention to obtain a three-dimensional structure with a corner portion rounded.
Figure 16B:
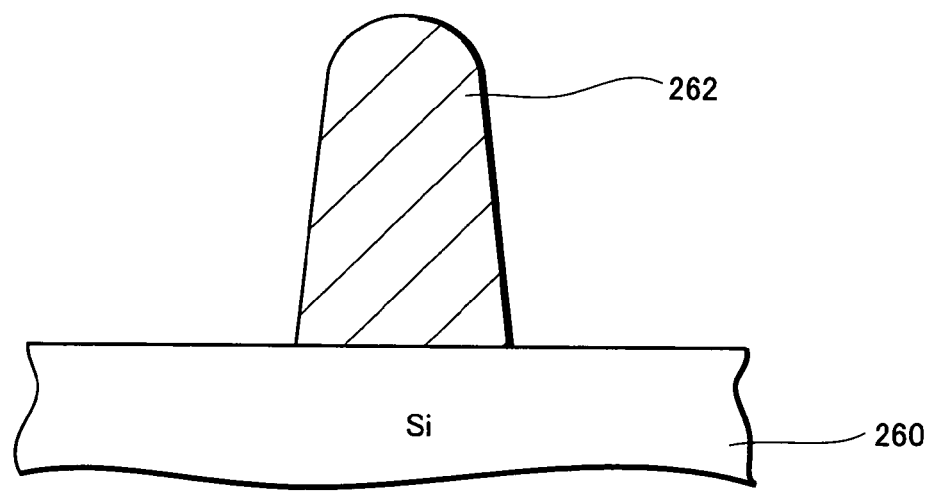

FIGS. 16A and 16B are cross-sectional views of a device for each primary manufacturing step in the case where a semiconductor substrate is processed using the method of forming a trench of the invention to obtain a three-dimensional structure with a corner portion rounded.

In the step as shown in FIG. 16(a), prepared is a silicon semiconductor substrate (or a compound semiconductor substrate enabling formation of an isotropic oxide film) 262, and part (261a, 261b) of the silicon semiconductor substrate 262 is selectively removed, thereby forming a pole-shaped protrusion 262 with a substantially perpendicular side face.

Next, an anisotropic sacrifice oxide film is formed on the side face (including the shoulder portion) of the pole-shaped protrusion 262 and is removed, and the shoulder portion of the pole-shaped protrusion 262 is rounded. Further, the side face of the pole-shaped protrusion 262 can be provided with gentle inclination. In this way, as shown in FIG. 16B, a fine semiconductor three-dimensional structure is obtained with the shoulder portion rounded.

Embodiment 11

This Example describes the case of forming the so-called three-dimensional transistor using the semiconductor processing technique as described in Example 9.

Figure 17:
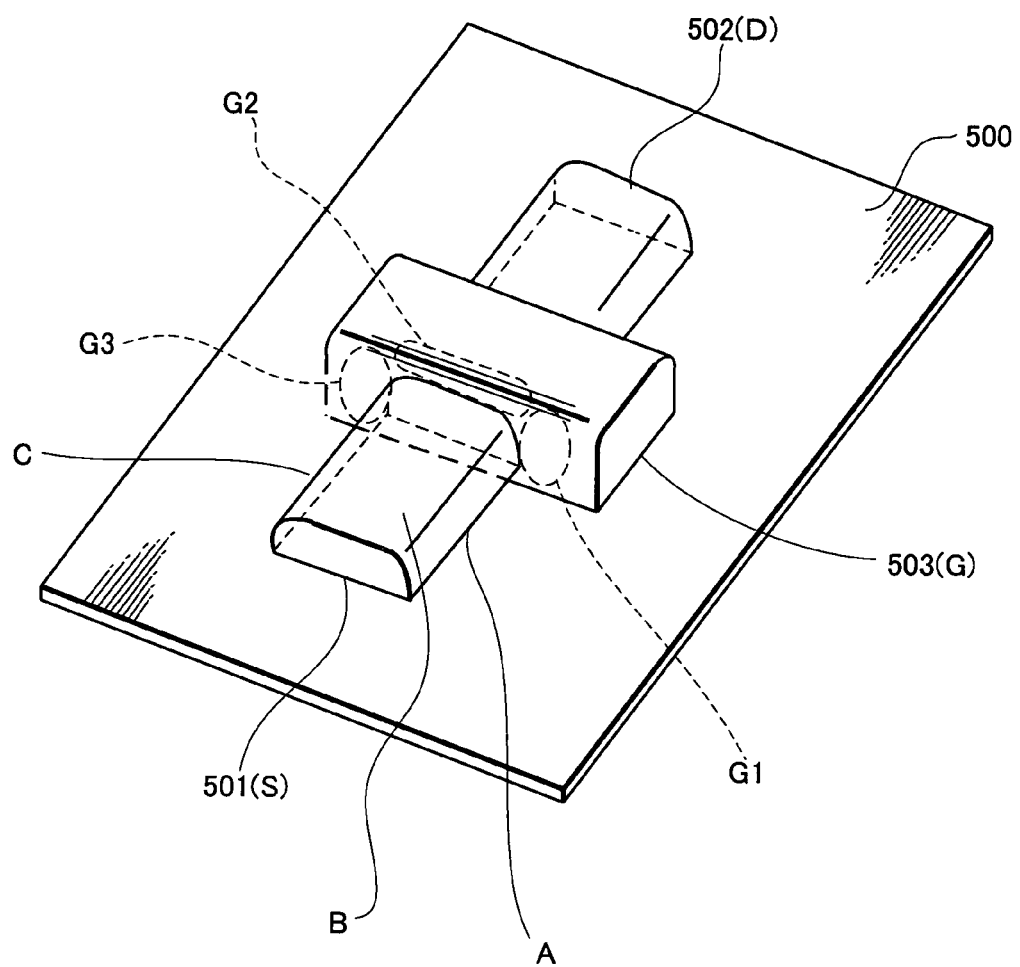
FIG. 17 is a perspective view showing a structure of a three-dimensional transistor (tri-gate transistor) formed using the semiconductor processing technique shown in FIG. 16.

FIG. 17 is a perspective view showing a structure of a three-dimensional transistor (tri-gate transistor) formed using the semiconductor processing technique shown in FIG. 16.

As shown in the figure, the three-dimensional transistor has a first three-dimensional structure with a source (S) 501 and drain (D) 502, and a second three-dimensional structure 503 which is perpendicular to the first three dimensional structure and functions as a gate (G).

The first three-dimensional structure has a main face (B) and side faces (A,C) perpendicular to the main face (B). The three-dimensional transistor has a feature that a channel is formed in each of three faces, the main face (B) and side faces (A,C). In other words, three channels are formed in three different faces of the first structure in a single transistor, and it is thereby possible to assure the current capability larger than that in the conventional planer transistor with the same size.

In the figure, G1, G2 and G3 surrounded by dotted lines are respectively a first gate, second gate and third gate. By the three gates (G1 to G3), the channel is formed in each of different faces (A to C) in the first structure.

It is desirable to perform the rounding processing on corner portions of the first three-dimensional structure (510, 502) and second three-dimensional structure (503), to prevent concentration of electric field, or to enable formation of an excellent surface protection film.

The rounding of the corner portion can be implemented by using the semiconductor processing technique of the invention as described in Example 9.

Thus, the semiconductor processing technique using the trench forming technique of the invention is usable in manufacturing a three-dimensional transistor.

As described above, according to the present invention, an anisotropic oxide film (such that the thickness in the shoulder portion is thicker than that in the other portion and the thickness is locally different) is used as a sacrifice oxide film and then removed, and it is thereby possible to concurrently obtain both the effect of backing off the shoulder portion of the trench intentionally and preferentially and broadening the opening of the trench and the effect of rounding sufficiently the corner portion of the backed shoulder portion.

With respect to the anisotropic oxide film (sacrifice oxide film), for example, by using a halogen oxidation method (for example, the halogen oxidation method using dichloroethylene, HCl, HBr or the like), it is possible to form an anisotropic oxide film locally having different thicknesses efficiently in oxidation processing in a single time, and thus, the manufacturing process is not complicated.

Further, the opening of the trench is broadened, while the corner portion is sufficiently rounded, whereby the embedding characteristic is improved in embedding an insulating film in the trench by plasma CVD or the like, and voids become hard to occur.

Furthermore, since the corner portion of the trench is adequately rounded, risks are reduced of stress concentration and electric field concentration in the upper end portion of the trench.

Still furthermore, since the corner portion of the trench is adequately rounded, voids are reduced, and flatness of the embedded oxide film is improved.

Moreover, provided that the shoulder portion of the trench is backed off, a side wall is formed to compensate for the backing off, a trench is formed by etching a semiconductor substrate using an etching mask including the side wall, and it is thereby possible to form a minute trench even when adopting the manufacturing process where the anisotropic oxide film is removed.

Further, since the side wall is removed before forming the anisotropic oxide film, the opening of the trench is broadened, and the oxidizing species are made easily reach the shoulder portion of the trench, thus contributing to the increased thickness of the anisotropic oxide film in the end portion of the opening of the trench. Furthermore, the opening in the upper portion of the trench being broadened by removal of the side wall is useful in improving the embedding characteristic in embedding an oxide film and the like in subsequent steps.

Moreover, an isotropic oxide film (with a substantially uniform thickness in the entire film) is formed on the inner surface of the trench before embedding an insulating film in the trench, and it is thereby possible to obtain effects of prevention of damage to the semiconductor substrate in embedding the insulating film in the trench, relief of stress between the embedded insulating film and the inner wall of the trench, promotion of smooth embedding, and the like. In this aspect, the inner surface of the trench undergoes anisotropic oxidation and isotropic oxidation, and by using both anisotropic oxidation and isotropic oxidation, it is possible to effectively resolve inconvenience due to the processing for embedding the insulating film in the trench and the like.

Further, by forming a nitride film on an isotropic oxide film after forming the isotropic oxide film on the inner surface of the trench, it is possible to prevent oxygen from moving from the embedded oxide film to the isotropic oxide film on the surface of the trench, and further prevent the isotropic oxide film from growing (expanding) unnecessarily. When the oxide film on the surface of the trench expands even slightly, the width of the trench increases, and such fears arise that the stress between the silicon substrate and oxide film increases to increase the interface state density, and that the leak current increases, however, in the invention, there is no concern about such inconvenience occurring. Furthermore, since the nitride film also serves the function of preventing damage to the surface of the silicon substrate in embedding the oxide film (TEOS oxide film) in the trench, formation of the nitride film contributes to improvement of the capability of preventing damage to silicon.

Still furthermore, in embedding the insulating film in the trench, the position of the surface of the insulating film is made lower than the position of the opening of the trench, and it is thereby possible to use the rounded shoulder portion of the trench and vicinity thereof as a channel region of the MOS transistor. In other words, such a structure is provided that a channel is induced in the rounded shoulder portion of the trench and vicinity thereof on the surface of the semiconductor substrate, the gate width (W) of the MOS transistor is intentionally expanded to increase the channel conductance (W/L: L is the channel length) in the MOS transistor, and it is thereby possible to suppress reduction in the current capability of the MOS transistor due to fine patterning.

According to the invention, it is possible to obtain a semiconductor device with excellent characteristics which enables uniform embedding of the insulating film in the trench, assurance of flatness in the shoulder portion of the trench, and assurance of formation of a gate oxide film with good quality, further enables the rounded shoulder portion of the trench and vicinity thereof to be used as a channel region of the MOS transistor, and is capable of suppressing reduction in the current capability of the MOS transistor due to fine patterning by increasing the channel conductance (W/L) of the MOS transistor.

According to the invention, it is possible to manufacture DRAM with a high degree of integration and less failure in characteristics. Similarly, according to the invention, it is made possible to manufacture SRAM, Flash Memory, and nonvolatile memory LSI (where PROM, EPROM and the like is integrated), or LSI with junction FETs (JFETs) integrated each with excellent characteristics and a high degree of integration. Further, the invention is applicable to manufacturing of bipolar IC using shallow trench isolation (STI) as element isolation. Similarly, the invention is applicable to manufacturing of a trench capacitor.

The transistor manufactured by the method of manufacturing a semiconductor device of the invention is useful as a MOS transistor constituting an input protection circuit or an element transistor (for example, power based transistor with a trench gate).

Further, the invention is usable in manufacturing of a MEMS (Micro Electro Mechanical System) element. In other words, also in manufacturing of a MEMS element, there is a demand for formation of a minute trench, demands are considered for providing the inner wall of the trench with inclination, backing off the shoulder portion preferentially to broaden the opening, or rounding the corner portion of the shoulder portion, and the invention is usable in manufacturing a MEMS element.

Similarly, the invention is usable in manufacturing a trench capacitor with large capacitance.

Further, the trench forming technique of the invention is applicable to formation of a minute three-dimensional structure with the corner portion rounded by processing a semiconductor substrate. For example, by forming current channels on three different faces of a three-dimensional structure, it is possible to form a tri-gate transistor that is one of three-dimensional transistors.

According to the invention, it is made possible to sufficiently back off a shoulder portion (upper end portion of an opening) of the trench, while adequately rounding a corner portion to broaden the opening in a single time of processing, thereby implementing an excellent embedding characteristic of an insulating film filled in the trench to prevent the occurrence of a void, to assure high-accuracy formation of a minute trench when the shoulder portion of the trench is backed off, and to form the trench capable of contributing to enhancement of the current capability of an insulting gate type field-effect transistor formed adjacent to the trench.

According to the invention, it is possible to establish the method of forming shallow trench isolation (STI) capable of both obtaining formation of minute trench isolation (trench for element isolation) and assurance of a channel width in a field-effect transistor formed adjacent to the trench for element isolation, and the method of manufacturing a semiconductor device for embedding an insulating film in the STI, forming an insulating film on the film, and providing a conductive layer crossing the STI on the insulating film.

According to the present invention, it is possible to efficiently implement mass-production of semiconductor device such as DRAM, SRAM, Flash Memory, element transistor, MEMS element and the like each with a high degree of integration and high quality. Further, the invention is usable in manufacturing a trench capacitor.

The invention has effects of enabling formation of a minute trench and excellent embedding of an insulating film in the trench to be compatible with each other, and further enabling assurance of a required channel width of an MOS transistor formed adjacent to STI. Accordingly, the invention is useful as a method of manufacturing a semiconductor device with a high degree of integration, as a fine semiconductor device such as DRAM, SRAM, Flash Memory, MEMS element and the like, and as three-dimensional processing technique of a trench capacitor and semiconductor device.

This application is based on the Japanese Patent Application No. 2005-215390 filed on Jul. 26, 2005, the entire content of which is expressly incorporated by reference herein.

What is claimed is:

1. A method of manufacturing a semiconductor device, comprising:
    forming a first trench in a semiconductor substrate, the first trench having a first opening size;
    performing oxidation with anisotropy on an inner surface of the first trench to form a sacrifice oxide film, the sacrifice oxide film having a thickness that is different locally such that a thickness of the sacrifice oxide film in a shoulder portion of the first trench is thicker than a thickness of the sacrifice oxide film in a portion other than the shoulder portion of the first trench;
    removing the sacrifice oxide film to preferentially back off the shoulder portion of the trench while rounding a shape of the shoulder portion, the first trench being thereby converted into a second trench that has a second opening size that is larger than the first opening size of the first trench;
    performing isotropic oxidation on an inner surface of the second trench to form an oxide film on the inner surface of the second trench, a substantial entirety of the oxide film has substantially a uniform thickness so that an opening size defined by the oxide film is smaller than the second opening size of the second trench and larger than the first opening size of the first trench; and
    filling the second trench with an insulating film with an intervention of the oxide film.

2. The method as claimed in claim 1, wherein the forming the first trench comprises:
    forming on the semiconductor substrate a mask layer having an opening, the opening being defined by a side surface of the mask layer;
    forming a sidewall spacer on the side surface of the mask layer defining the opening; and
    etching the semiconductor substrate by using the mask layer and the sidewall spacer as the mask to form the first trench.

3. The method as claimed in claim 2, wherein the forming the first trench further comprises removing the sidewall spacer after the etching the semiconductor substrate, and each of the performing oxidation with anisotropy, the removing the sacrifice oxide film, the performing isotropic oxidation and the filling the second trench is carried out while keeping the mask layer left.

4. The method as claimed in claim 3, further comprising removing the mask layer after the filling the second trench.

5. The method as claimed in claim 1, wherein the forming the first trench comprises:
    forming on the semiconductor substrate a mask layer having an opening; and
    etching the semiconductor substrate by using the mask layer as the mask to form the first trench; and
    wherein each of the performing oxidation with anisotropy, the removing the sacrifice oxide film, the performing isotropic oxidation and the filling the second trench is carried out while keeping the mask layer left.

6. The method as claimed in claim 5, further comprising removing the mask layer after the filling the second trench.

* * * * *